(12) United States Patent
Liu et al.

(10) Patent No.: US 12,550,304 B2
(45) Date of Patent: Feb. 10, 2026

(54) ELECTRONIC DEVICE

(71) Applicant: Huawei Technologies Co., Ltd., Shenzhen (CN)

(72) Inventors: Yu Liu, Shanghai (CN); Zhao Ma, Shanghai (CN); Qikun Liao, Dongguan (CN); Haijian Yang, Nanjing (CN); Yang Zhao, Shanghai (CN)

(73) Assignee: HUAWEI TECHNOLGOIES CO., LTD., Shenzhen (CN)

( * ) Notice: Subject to any disclaimer, the term of this patent is extended or adjusted under 35 U.S.C. 154(b) by 152 days.

(21) Appl. No.: 18/263,271

(22) PCT Filed: Jan. 11, 2022

(86) PCT No.: PCT/CN2022/071183
§ 371 (c)(1),
(2) Date: Jul. 27, 2023

(87) PCT Pub. No.: WO2022/161152
PCT Pub. Date: Aug. 4, 2022

(65) Prior Publication Data
US 2024/0324157 A1 Sep. 26, 2024

(30) Foreign Application Priority Data

Jan. 27, 2021 (CN) .......................... 202110112793.6
Jan. 27, 2021 (CN) .......................... 202110112884.X
Jan. 29, 2021 (CN) .......................... 202110130650.8

(51) Int. Cl.
*H05K 9/00* (2006.01)
*H04M 1/02* (2006.01)
(Continued)

(52) U.S. Cl.
CPC ........ *H05K 9/0067* (2013.01); *H04M 1/0277* (2013.01); *H05K 1/028* (2013.01); *H05K 1/189* (2013.01); *H05K 9/0084* (2013.01)

(58) Field of Classification Search
CPC .. H05K 9/00; H05K 1/02; H05K 1/08; H05K 1/0067; H05K 1/028; H05K 9/0084;
(Continued)

(56) References Cited

U.S. PATENT DOCUMENTS

2010/0230496 A1* 9/2010 Kim ................. G06K 19/07745
235/488
2011/0038128 A1 2/2011 Kitagawa et al.
(Continued)

FOREIGN PATENT DOCUMENTS

CN 208285353 U 12/2018
CN 111083255 A 4/2020
(Continued)

*Primary Examiner* — Danny Nguyen
(74) *Attorney, Agent, or Firm* — Conley Rose, P.C.

(57) ABSTRACT

An electronic device includes an insulation top cover, a middle frame, a display, and a flexible printed circuit electrically connected to an end of the display, where one side of the insulation top cover is located above an outer edge of the display, and the other side of the insulation top cover is connected to the middle frame. The electronic device further includes an electrostatic protection structure, where the electrostatic protection structure is configured to ground, at the middle frame, static electricity entering the electronic device from a gap between the display and the insulation top cover, to discharge, on the middle frame, the static electricity entering the electronic device.

19 Claims, 26 Drawing Sheets

(51) Int. Cl.
*H05K 1/02* (2006.01)
*H05K 1/18* (2006.01)

(58) Field of Classification Search
CPC . H04M 1/02; H04M 1/0277; G02F 1/133334; G02F 13/136204; G02F 2202/22; H05F 3/02
USPC .................................................. 361/212, 220
See application file for complete search history.

(56) References Cited

U.S. PATENT DOCUMENTS

| | | | |
|---|---|---|---|
| 2012/0162874 A1* | 6/2012 | Ito | G03B 17/00 361/679.01 |
| 2014/0218656 A1 | 8/2014 | Maruno | |
| 2020/0192433 A1 | 6/2020 | Shin et al. | |
| 2023/0055951 A1* | 2/2023 | Jang | H05K 5/00 |

FOREIGN PATENT DOCUMENTS

| | | |
|---|---|---|
| JP | 2013229505 A | 11/2013 |
| KR | 20080038592 A | 5/2008 |

\* cited by examiner

ELECTRONIC DEVICE

CROSS-REFERENCE TO RELATED APPLICATIONS

This is a National Stage of International Patent Application No. PCT/CN2022/071183 filed on Jan. 11, 2022, which claims priority to Chinese Patent Application No. 202110112884.X filed on Jan. 27, 2021, Chinese Patent Application No. 202110130650.8 filed on Jan. 29, 2021, and Chinese Patent Application No. 202110112793.6 filed on Jan. 27, 2021. All of the aforementioned applications are hereby incorporated by reference in their entireties.

TECHNICAL FIELD

The present invention relates to the field of display technologies, and in particular, to an electronic device.

BACKGROUND

With continuous development of display technologies of mobile terminal devices such as a mobile phone, a light and thin display becomes a development trend of the display technologies. However, as the display becomes lighter and thinner, it is increasingly difficult to improve an electrostatic discharge effect tolerance capability of the display. Especially, some electrostatic sensitive devices (Electrostatic Sensitive Devices, ESSDs) are prone to fail due to an electrostatic discharge effect during use without an appropriate protection measure.

Currently, on some terminals, antistatic measures are taken for components of displays, to ensure an electrostatic tolerance capability of the components. However, as the displays become lighter and thinner, it is increasingly difficult to take the antistatic measures for the components of the displays. In addition, displays of some terminal devices use a non-full lamination design. The display is connected to a main board through a flexible printed circuit (Flexible Printed Circuit, FPC), and the FPC is bent on a side surface of the terminal and connected to a circuit board. There is a gap between the side surface of the terminal and the display. Consequently, static electricity enters the device from the gap between the display and the side surface of the terminal. This is prone to damage a bending region of the FPC and cause the display to fail.

SUMMARY

Embodiments of this application provides an electronic device, so that static electricity entering the electronic device can be grounded, to prevent the static electricity from damaging a bending region of a flexible printed circuit in the electronic device.

An embodiment of this application provides an electronic device, including an insulation top cover, a middle frame, a display, and a flexible printed circuit electrically connected to an end of the display, where one side of the insulation top cover is located above an outer edge of the display, and the other side of the insulation top cover is connected to the middle frame.

The electronic device further includes: an electrostatic protection structure, where the electrostatic protection structure is configured to ground, at the middle frame, static electricity entering the electronic device from a gap between the display and the insulation top cover.

In this embodiment of this application, the electrostatic protection structure is disposed to guide the static electricity on the display to the middle frame for grounding, to avoid a problem that the display fails due to a power generation effect of the static electricity on a bending region of the flexible printed circuit. According to the technical solutions in this application, a process is simple, a higher electrostatic risk can be withstood, and reliability is higher. In addition, according to the technical solutions of this application, impact of the electrostatic protection structure on an antenna radiation signal can be further avoid. This is more in line with light and thin development of a product like a mobile phone.

The electrostatic protection structure includes a guide part and at least one ground pin electrically connected to the guide part, and the guide part is electrically connected to the middle frame through the ground pin.

In a possible implementation, the flexible printed circuit has a bending region close to a frame of the middle frame, and the electrostatic protection structure is disposed close to the bending region.

In a possible implementation, the middle frame includes at least an outer metal frame and an inner insulation frame, at least a part of the outer metal frame is located on an outer side of the inner insulation frame, and the electrostatic protection structure is electrically connected to the outer metal frame.

In a possible implementation, the electrostatic protection structure is disposed on an inner wall that is of the inner insulation frame and that is close to the bending region, the guide part of the electrostatic protection structure extends along a width direction of the flexible printed circuit, and the ground pin of the electrostatic protection structure is electrically connected to the outer metal frame.

In a possible implementation, a distance between the guide part of the electrostatic protection structure and the outer edge of the display is less than a distance between the bending region and the outer edge of the display.

In a possible implementation, the electrostatic protection structure is disposed on an inner surface that is of the insulation top cover and that corresponds to the flexible printed circuit, one end of the electrostatic protection structure is close to an end that is of the insulation top cover and that is away from the middle frame, and the other end of the electrostatic protection structure is electrically connected to the outer metal frame.

In a possible implementation, the electronic device further includes at least one conductive spring. The conductive spring is connected to an end that is of the insulation top cover and that is close to the middle frame, the conductive spring is in electrical contact with the electrostatic protection structure, and the electrostatic protection structure is electrically connected to the outer metal frame through the conductive spring.

In a possible implementation, the conductive spring has at least one first abutting part, and the first abutting part is configured to be in electrical contact with the middle frame, so that the conductive spring is electrically connected to the middle frame.

In a possible implementation, the conductive spring further has at least one second abutting part, and the second abutting part is configured to be in electrical contact with the electrostatic protection structure, so that the conductive spring is electrically connected to the electrostatic protection structure.

In a possible implementation, an avoidance groove is provided on a side wall at an end that is of the insulation top cover and that is connected to the middle frame, and the avoidance groove is opposite a side wall, on which the first abutting part is disposed, of the conductive spring.

In a possible implementation, the ground pin of the electrostatic protection structure includes two sub-pins. There is a spacing between the two adjacent sub-pins, and the spacing is opposite the avoidance groove.

In a possible implementation, the conductive spring further has at least one clamping part, and the clamping part is configured to clamp the end that is of the insulation top cover and that is connected to the middle frame, so that the conductive spring is disposed on the insulation top cover.

In a possible implementation, the clamping part is a clamping groove, and a width of the clamping groove is less than a wall thickness at the end that is of the insulation top cover and that is connected to the middle frame.

In a possible implementation, the conductive spring further has a position-limiting part, and a position-limiting slot fitting with the position-limiting part is provided at the end that is of the insulation top cover and that is connected to the middle frame.

In a possible implementation, the position-limiting part is a hook-shaped structure formed by extending a clamping side wall of the clamping part.

In a possible implementation, an assembly groove is provided at an end that is of the middle frame and that is close to the insulation top cover, and the end that is of the insulation top cover and that is connected to the middle frame is located in the assembly groove.

In a possible implementation, the electrostatic protection structure is a conductive layer made of a conductive material, and a resistance of the electrostatic protection structure is less than 5 ohms.

In a possible implementation, the middle frame close to the electrostatic protection structure includes a first metal frame, a second metal frame, and a third metal frame that are separated from each other:

the second metal frame is disposed between the first metal frame and the third metal frame, and both the first metal frame and the third metal frame are antenna radiators; and the ground pin of the electrostatic protection structure is electrically connected to the second metal frame, and the ground pin is away from the first metal frame and the third metal frame.

In a possible implementation, a spacing width between each of two ends of the second metal frame and each of the first metal frame and the third metal frame is greater than 0.8 mm.

In a possible implementation, a distance between the guide part of the electrostatic protection structure and each of the first metal frame and the third metal frame is greater than 0.8 mm.

In a possible implementation, the insulation top cover includes a suspended part and a connecting part disposed around an outer edge of the suspended part;

the suspended part and the outer edge of the display at least partially overlap in a thickness direction of the electronic device, there is a gap between the suspended part and the display, and the connecting part is connected to the middle frame; and the guide part of the electrostatic protection structure is disposed on an inner surface of the suspended part, and the ground pin of the electrostatic protection structure is electrically connected to the middle frame along an inner surface of the connecting part.

In a possible implementation, an outer surface of the suspended part is a flat surface, and an outer surface of the connecting part is a slant surface or an arc surface.

These and other aspects, implementations, and advantages of example embodiments will become apparent with reference to the accompanying drawings and based on the embodiments described below. However, it should be understood that the specification and the accompanying drawings are only intended for illustrative purposes and do not serve as definitions that limit this application. For details, refer to the appended claims. Other aspects and advantages of this application will be described in the following descriptions. Some aspects and advantages will be apparent in the descriptions or learned of through practice of this application. In addition, the aspects and advantages of this application can be achieved and obtained by using the means particularly specified in the appended claims or a combination thereof.

DESCRIPTIONS OF REFERENCE NUMERALS

Figure 1:
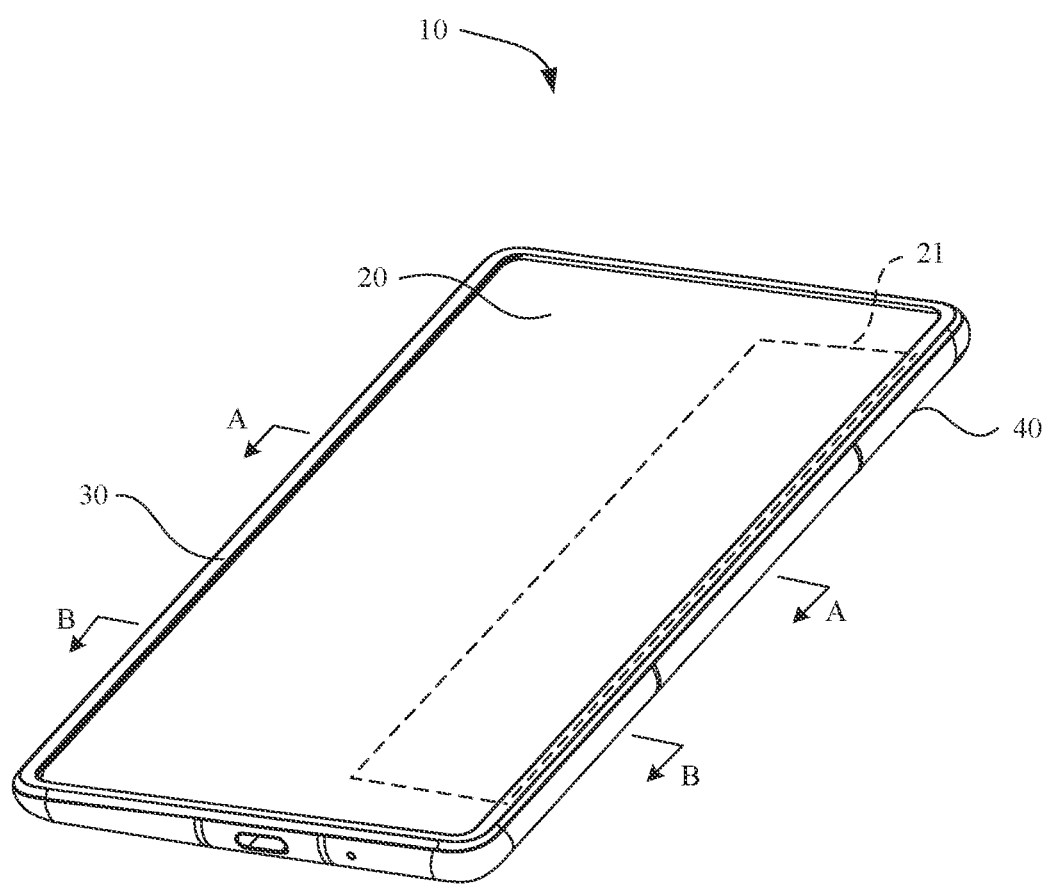
FIG. 1 is a schematic diagram of a three-dimensional structure of an electronic device according to an embodiment of this application.

10-mobile phone; 20-display; 21-flexible printed circuit; 21*a*-bending region;

22-circuit board; 30-insulation top cover; 301-suspended part; 302-connecting part:

3021-accommodating groove; 302*a*-position-limiting slot; 302*b*-assembly end; 302*c*-avoidance groove;

31-electrostatic protection structure; 311-guide part; 312-ground pin; 312*a* and 312*b*-sub-pins;

312*c*-spacing; 32*a*-conductive spring; 321-clamping part; 322-first abutting part;

3221-side wall; 323-position-limiting part; 324-second abutting part; 325-clamping side wall;

40-middle frame; 41-outer metal frame; 42-inner insulation frame; 411-first metal frame;

412-second metal frame; 413-third metal frame; 414*a* and 414*b*-spacers;

401-assembly groove; 50-battery cover; 20*a*-glass cover; 20*b*-display module.

DESCRIPTION OF EMBODIMENTS

Embodiments of this application provide an electronic device. The electronic device may include, but is not limited to, a mobile terminal, a fixed terminal, or a foldable terminal with a display, such as a mobile phone, a tablet computer, a notebook computer, an ultra-mobile personal computer (ultra-mobile personal computer, UMPC), a handheld computer, a walkie-talkie, a netbook, a POS terminal, a personal digital assistant (personal digital assistant, PDA), a dashboard camera, or a security protection device.

In an embodiment of this application, an example in which the mobile phone is the foregoing electronic device is used for description, and the mobile phone is an antistatic mobile phone with a non-full lamination display.

For an existing mobile phone with a non-full lamination display, the display is connected to a main board through a flexible printed circuit (FPC), and the FPC is bent at a side of the terminal and connected to the main board. A gap is usually reserved between a housing of the terminal and the display. Consequently, static electricity enters the device from the gap between the display and the housing of the terminal, and a circuit of the main board or a flexible printed circuit is prone to be damaged, thereby affecting display and touch control of the display, and affecting a service life of the terminal device.

In this embodiment of this application, an electrostatic protection structure is disposed on a middle frame, so that the static electricity entering the mobile phone from the gap between the display and the housing of the mobile phone can be guided for grounding, to effectively prevent the display from failing due to an electrostatic discharge effect, and prolong service lives of the display and the mobile phone.

A structure of the mobile phone provided in this embodiment of this application is described in detail in the following scenarios. The technical solutions in this application are applicable to a bar-type mobile phone, or are applicable to a foldable phone (the foldable phone may include an inward foldable phone and an outward foldable phone). In a scenario 1, the bar-type mobile phone is mainly used as an example for description. In a scenario 2, the foldable phone is mainly used as an example for description.

Scenario 1

As shown in FIG. 1, a mobile phone 10 may include a display 20, an insulation top cover 30, a middle frame 40, and a flexible printed circuit 21 and a circuit board 22 that are located in the mobile phone 10. The flexible printed circuit 21 is located on a side of the mobile phone 10. For details, refer to a dashed-line part in FIG. 1. The flexible printed circuit 21 is disposed close to a side of the middle frame 40, and one end of the flexible printed circuit 21 is disposed close to the side of the middle frame 40. One end of the flexible printed circuit 21 is electrically connected to a side of the display 20, and the other end of the flexible printed circuit 21 is electrically connected to the circuit board 22 (as shown in FIG. 2 below) in the mobile phone 10.

Figure 2:
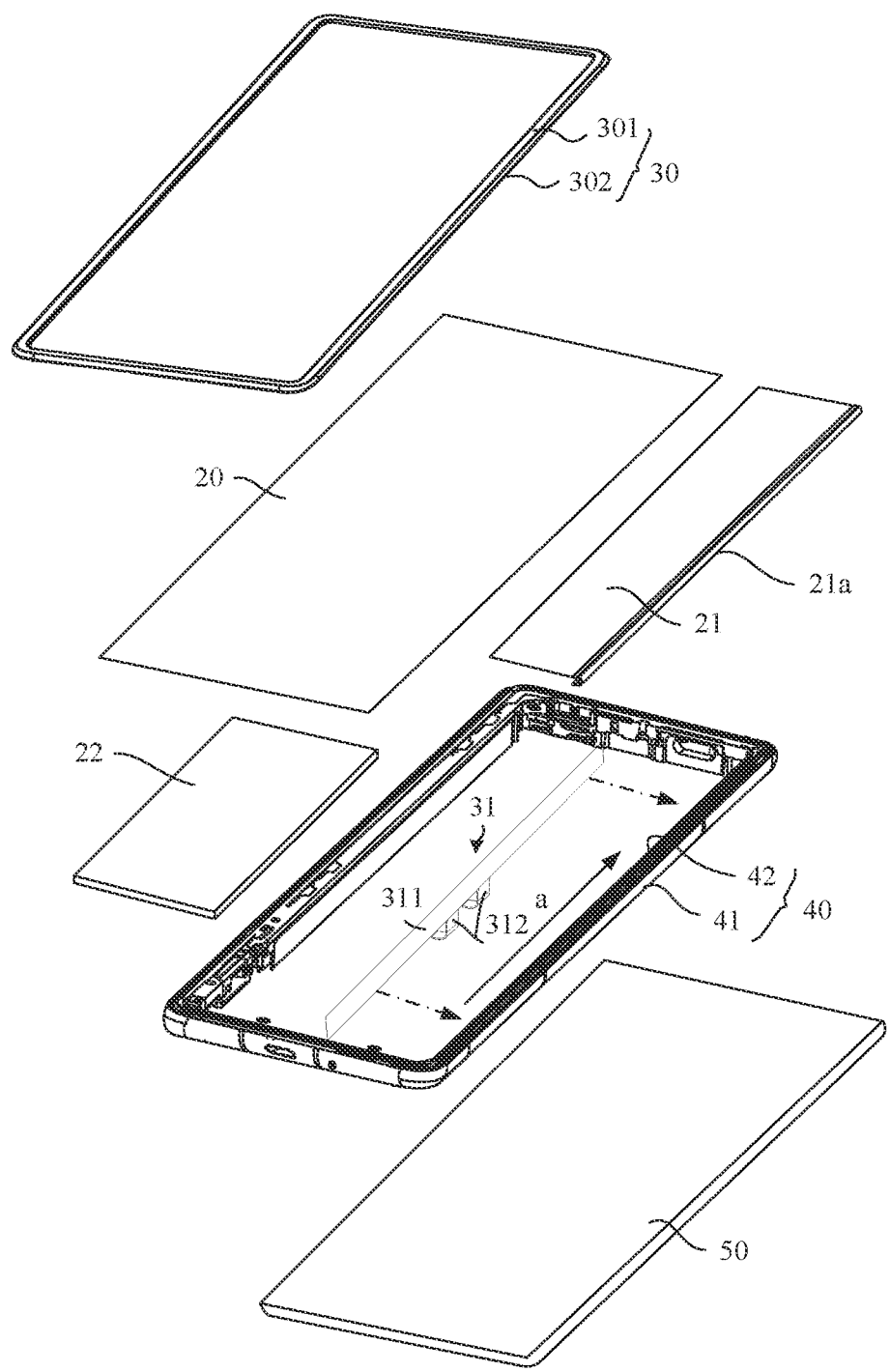
FIG. 2 is a schematic diagram of an exploded structure of an electronic device according to an embodiment of this application.

As shown in FIG. 2, the mobile phone 10 further includes a battery cover 50. The battery cover 50 and the display 20 are respectively located on upper and lower sides of the middle frame 40, and inner surfaces of the display 20, the insulation top cover 30, the middle frame 40, and the battery cover 50 enclose a cavity. Components such as a battery, the flexible printed circuit 21, and the circuit board 22 are disposed in the cavity.

As shown in FIG. 2, a bending region 21a of the flexible printed circuit 21 exists at a position at which the flexible printed circuit 21 is connected to the display 20 and the circuit board 22 (as shown in FIG. 2 below), and the bending region 21a of the flexible printed circuit 21 is close to the side of the middle frame 40. For example, in FIG. 2, the bending region 21a is close to a right side of the middle frame 40.

When the antistatic electronic device is a foldable phone, because the foldable phone needs to be bent back and forth, the display 20 cannot be fastened to the middle frame 40 and the insulation top cover 30. In other words, there is a gap between the display 20 and each of the middle frame 40 and the insulation top cover 30. Alternatively, in some drop tests, when the insulation top cover 30 is fastened to the display 20, an impact force to which the insulation top cover 30 is subjected is prone to damage the display 20 during the drop tests. In this case, if static electricity on the display 20 is not grounded, the static electricity may enter the mobile phone from the gap between the display 20 and each of the middle frame 40 and the insulation top cover 30, causing damage to the circuit board 22, the flexible printed circuit 21, and the display 20 of the mobile phone.

Figure 3:
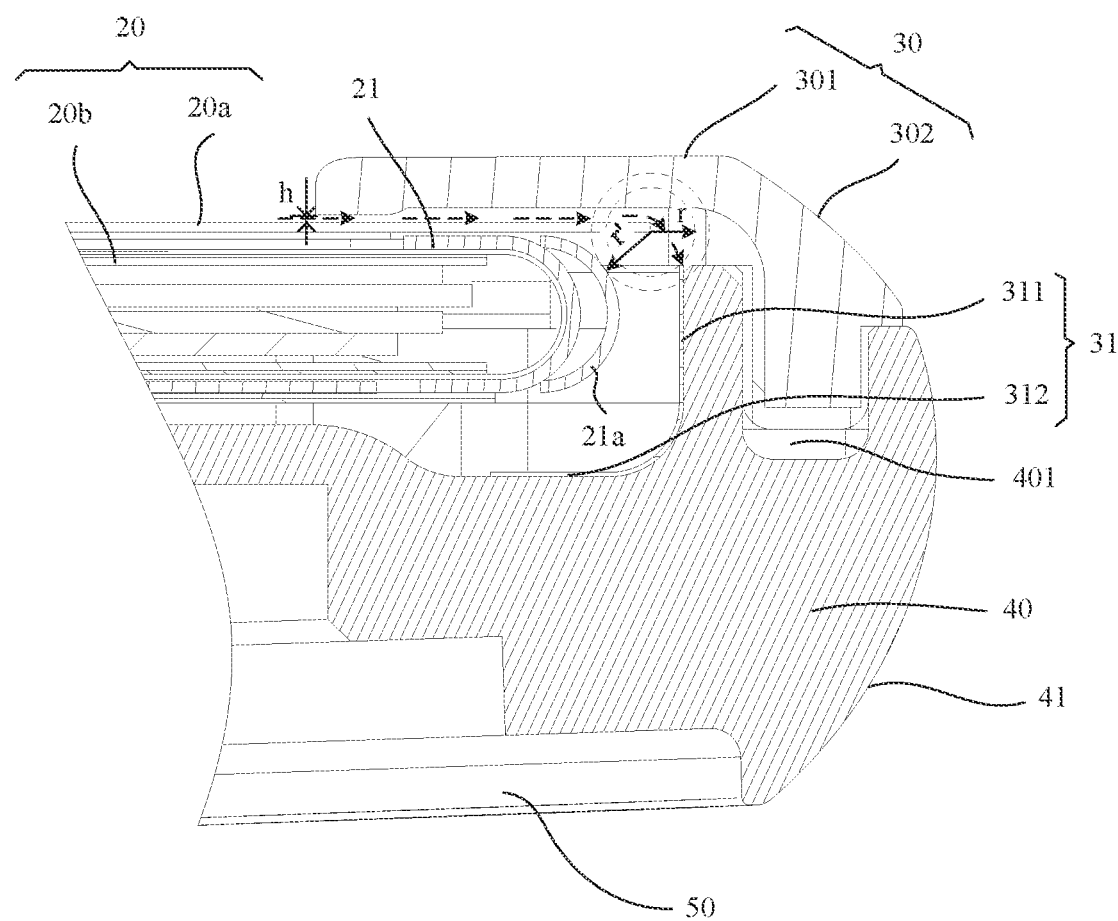
FIG. 3 is a partial sectional view of a side of an electronic device in which an electrostatic protection structure is disposed when the electronic device is cut along an A-A direction in FIG. 1.

Specifically, as shown in FIG. 3, one side of the insulation top cover 30 covers a top of the display 20, and the other side is connected to the middle frame 40. The insulation top cover 30 is configured to protect the display 20. There is a gap h between the insulation top cover 30 and the display 20 in a thickness direction of the mobile phone. In this way, when a user uses the mobile phone 10, static electricity generated on a hand of the user or generated by the display 20 may enter the mobile phone 10 from the gap h (refer to an electrostatic conduction path shown by a dashed arrow in FIG. 3). A discharge effect generated by the static electricity entering the mobile phone 10 may damage a component on the circuit board 22 or the flexible printed circuit 21 in the mobile phone 10, thereby damaging the display 20 and even causing damage to the mobile phone 10.

To resolve this problem, in this embodiment, as shown in FIG. 2 and FIG. 3, the mobile phone 10 further includes an electrostatic protection structure 31. The electrostatic protection structure 31 is configured to ground the static electricity entering from the gap h, to avoid damage to the flexible printed circuit 21 caused by the static electricity.

In this scenario, as shown in FIG. 2, the electrostatic protection structure 31 may be disposed on the middle frame 40, and is located on a side that is of the middle frame 40 and that is close to the bending region 21a of the flexible printed circuit. In this embodiment, the middle frame 40 may be a metal middle frame. When the middle frame 40 is the metal middle frame, the middle frame 40 may be used as a reference ground. In this way, when the electrostatic protection structure 31 is disposed on the middle frame 40, the electrostatic protection structure 31 is electrically connected to the middle frame 40, and then the electrostatic protection structure 31 is grounded through the middle frame 40.

Alternatively, in some examples, when the middle frame 40 is a non-metal middle frame, an end of the electrostatic protection structure 31 may be connected to a ground point on the circuit board 22 or a reference ground (for example, a support plate that is configured to support the display 20 and that is located between the display 20 and the battery (not shown)) in the mobile phone 10 to implement grounding.

The electrostatic protection structure 31 is disposed on an inner frame of the middle frame 40, so that appearance of the entire phone, performance of an antenna radiator, and other performance are not affected. In addition, the electrostatic protection structure 31 is disposed to guide the static electricity on the display 20 to the middle frame 40 for grounding, and an electrostatic protection measure is taken on the display 20 and an electronic component on the circuit board 22. Therefore, according to the technical solutions in this application, a process is simple, a higher electrostatic risk can be withstood, and reliability is higher.

To guide, to the electrostatic protection structure 31 to implement grounding, the static electricity entering from the gap h in FIG. 3, as shown in FIG. 3, a distance between an edge of the display and the electrostatic protection structure 31 is r, a distance between the edge of the display 20 and the bending region 21a of the flexible printed circuit is r', and r is less than r'. In this way, after entering from the gap h in FIG. 3, the static electricity is guided to the electrostatic protection structure 31 with a shorter discharge path, to avoid damage to the bending region 21a of the flexible printed circuit caused by the static electricity. The edge of the display may be an edge on the side on which the display 20 is connected to the flexible printed circuit 21.

In this embodiment, as shown in FIG. 3, the electrostatic conduction path is shown by the dashed arrow in FIG. 3. After entering from the gap h, the static electricity is transferred along the display 20 to an end, on which the flexible printed circuit 21 is disposed, of the display 20. Because the electrostatic protection structure 31 is closer to the end of the display 20, the static electricity is transferred to the electrostatic protection structure 31, and then the electrostatic protection structure 31 is grounded through the middle frame 40.

For an explanation, in a circuit of the circuit board 22 of the mobile phone, a "ground" and a "ground" communicate with each other, and a copper sheet on the circuit board 22, a shielding cover welding joint, a negative electrode of a battery holder, and the like are all "grounds" of the mobile phone. The middle frame 40 of the mobile phone is connected to the "grounds" of the mobile phone.

It should be noted that, as shown in FIG. 3, the display 20 may include a glass cover 20a and a display module 20b. The glass cover 20a is located on the display module 20b, and that the flexible printed circuit 21 is electrically connected to the display 20 is specifically that the flexible printed circuit 21 is electrically connected to the display module 20b of the display 20. Therefore, the gap h between the display 20 and a suspended part 301 of the insulation top cover 30 is specifically a gap h between the glass cover 20a and the suspended part 301 of the insulation top cover 30. As shown in FIG. 3, an outer edge of the glass cover 20a extends toward a frame of the middle frame 40.

It should be noted that, in some embodiments, for example, on a foldable phone, a value of the gap h between the insulation top cover 30 and the display 20 is greater than zero. In this case, the static electricity enters the mobile phone 10 from the gap h between the insulation top cover 30 and the display 20. However, in some other embodiments, for example, on a bar-type phone, the suspended part 301 is disposed in contact with the display 20. Due to a limitation on a processing process, the insulation top cover 30 is in contact with the display 20, but is not sealed to the display 20. In this case, the gap h between the insulation top cover 30 and the display 20 is infinitely close to zero, but is not zero. Therefore, the static electricity still enters the mobile phone 10 from a contact surface between the insulation top cover 30 and the display 20.

In other words, provided that the display 20 and the suspended part 301 of the insulation top cover 30 are not in a sealed state, the gap h may exist, but the value may vary. In other words, any technical solution in which the static electricity enters the mobile phone 10 from the edge of the display 20, and the static electricity is grounded by using the electrostatic protection structure 31 falls within the protection scope of the technical solutions in this application.

To ensure that a distance (namely, r) between the electrostatic protection structure 31 and an outer edge at an end that is of the display 20 and that is electrically connected to the flexible printed circuit 21 is less than a distance (r' in FIG. 2) between the end and the bending region 21a of the flexible printed circuit. As shown in FIG. 3, the outer edge of the glass cover 20a of the display 20 may extend toward the middle frame 40, to reduce a distance between the display 20 and the middle frame 40. Alternatively, a distance between the bending region 21a of the flexible printed circuit and an end of the glass cover 20a of the display 20 may be increased, and may be set based on a specific case. This is not specifically limited in this application.

In this embodiment of this application, the electrostatic protection structure 31 is a conductive layer, for example, a metal layer made of a metal material. A resistance of the electrostatic protection structure may be less than 5 ohms.

For example, the electrostatic protection structure 31 may be made of a metal material with high conductivity, and the metal material with high conductivity may be, for example, conductive silver paste, and the conductive silver paste may include a resin adhesive and silver powder. Proportions of the resin adhesive and the silver powder of the conductive silver paste are not specifically limited in this embodiment. A resistance of a cured metal layer may be less than 5 ohms, and the cured metal layer may have a sufficient adhesive force to be fastened to the insulation top cover 30. For example, the metal layer may be made of a silver material, has good conductivity, and has high oxidation resistance. This can ensure high conductivity of the electrostatic protection structure 31 to guide the static electricity on the display 20 to the electrostatic protection structure 31. In addition, oxidation resistance can be implemented, and a service life of the electrostatic protection structure 31 can be prolonged.

It should be noted that a material of the electrostatic protection structure 31 in this application is not limited to silver, and may alternatively be another material with high conductivity, like copper, aluminum, or gold.

In this embodiment, a conductive material may be disposed on the inner surface of the insulation top cover 30 by using a printing, spraying, or laser direct structuring process.

In this embodiment of this application, when the electrostatic protection structure 31 is grounded through the middle frame 40, the middle frame 40 may be a metal middle frame, and the metal middle frame is electrically connected to a ground of the circuit board 22 of the mobile phone 10. In this way, after entering from the gap h, the static electricity may be discharged on the metal middle frame 40 along the electrostatic protection structure 31. Certainly, in some examples, the middle frame 40 may alternatively be an integral structure including a metal material and a non-metal material, and an end of the electrostatic protection structure 31 is electrically connected to the metal material of the middle frame 40 to implement grounding.

For example, as shown in FIG. 2, the middle frame 40 may include an outer metal frame 41 and an inner insulation frame 42. At least a part of the outer metal frame 41 is located on an outer side of the inner insulation frame 42, and an end that is of the electrostatic protection structure 31 and that faces the middle frame 40 is electrically connected to the outer metal frame 41. Certainly, in some examples, the electrostatic protection structure 31 may alternatively be electrically connected to a metal middle plate (not shown) of the middle frame 40. The inner insulation frame 42 may be a frame formed by molding the outer metal frame 41 and plastic.

In this embodiment of this application, the electrostatic protection structure 31 may be disposed on an inner wall that is of the inner insulation frame 42 and that is close to the bending region 21a of the flexible printed circuit.

In this embodiment of this application, as shown in FIG. 3, the insulation top cover 30 may include the suspended part 301 and a connecting part 302, and the connecting part 302 is disposed at an outer edge of the suspended part 301. As shown in FIG. 3, there is a gap between the suspended part 301 and the display 20. For example, in FIG. 3, the suspended part 301 and an outer edge of the display 20 at least partially overlap in a thickness direction of the electronic device, and there is the gap h between the suspended part 301 and the display 20. It should be noted that, in some embodiments, the suspended part 301 may be in contact with the display 20. The connecting part 302 is connected to the middle frame 40. For example, the connecting part 302 may be connected to the middle frame 40 through clamping, bonding (for example, an adhesive), or the like.

The suspended part 301 and the connecting part 302 may be integrally formed. An outer surface of the suspended part 301 may be a flat surface, and an outer surface of the connecting part 302 may be a slant surface or an arc surface.

A structure of the insulation top cover 30 shown in the accompanying drawing in this embodiment is one of a plurality of structures of the insulation top cover 30. A specific shape and size of the insulation top cover 30 do not constitute a limitation on the protection scope of the technical solutions in this application. The insulation top cover 30 disposed on a side of the display 20 falls within the protection scope of this application.

In this embodiment of this application, as shown in FIG. 2, the electrostatic protection structure 31 may include a guide part 311 and at least one ground pin 312 connected to the guide part 311. For example, in FIG. 2, there may be two ground pins 312. Certainly, in some other examples, one or more ground pins 312 may alternatively be provided.

In this embodiment of this application, the guide part 311 extends, on the inner surface of the middle frame 40, along a width direction (namely, a direction a in FIG. 2) of the bending region 21a. For example, as shown in FIG. 2, the width direction of the bending region 21a is a length direction a of the insulation top cover 30 in FIG. 2. Therefore, the guide part 311 may be disposed by extending along the length direction a of the insulation top cover 30 on the inner surface of the insulation top cover 30. As shown in FIG. 3, the guide part 311 may be disposed on an inner surface that is of the suspended part 301 and that corresponds to the flexible printed circuit 21, the ground pin 312 may be disposed on an inner surface of the connecting part 302, and an end of the ground pin 312 is electrically connected to the metal frame of the middle frame 40.

In this embodiment of this application, the guide part 311 is a long-strip structure, and two ground pins 312 are disposed at intervals on a side of the guide part 311. In this embodiment, because the ground pin 312 is used for grounding, the ground pin 312 needs to be electrically connected to the outer metal frame 41 of the middle frame 40, and an area of the ground pin 312 may be less than an area of the guide part 311.

A length of the guide part 311 may be greater than or equal to a width of the bending region 21a of the flexible printed circuit 21. In this way, the guide part 311 may cover at least two ends of the bending region 21a of the flexible printed circuit 21 in a length direction, to ensure that the flexible printed circuit 21 located below the display 20 is not damaged by the static electricity.

It should be noted that a specific shape and thickness of the electrostatic protection structure 31 do not constitute a limitation on the protection scope of the technical solutions in this application, and that the static electricity can be guided to the middle frame 40 and grounded through the middle frame 40 falls within the protection scope of the technical solutions in this application. In addition, a structure of the guide part 311 does not constitute a limitation on the protection scope of the technical solutions in this application. The guide part 311 may be a rectangular long-strip structure in this embodiment, or may be a long-strip structure of another shape, like a trapezoidal long-strip structure, provided that the guide part 311 may cover the bending region of the flexible printed circuit 21. A shape of the ground pin 312 is not limited to a rectangular sheet structure and an arc-shaped sheet structure that are shown in the figure, and may alternatively be a sheet structure of another shape, like a trapezoidal sheet structure or a triangular sheet structure, provided that the guide part 311 can be electrically connected to the middle frame 40.

In this embodiment of this application, when the electrostatic protection structure 31 is electrically connected to the middle frame 40 through the ground pin 312, the ground pin 312 may be electrically connected to the middle frame 40 through conductive glue, conductive foam, or a conductive spring.

In this embodiment of this application, as shown in FIG. 2 and FIG. 3, an assembly groove 401 is provided at an end that is of the middle frame 40 and that faces the insulation top cover 30, and an end of the connecting part 302 of the insulation top cover 30 is located in the assembly groove 401. In this embodiment, an adhesive may be provided between the end of the connecting part 302 of the insulation top cover 30 and the assembly groove 401 of the middle frame 40, to implement a connection between the insulation top cover 30 and the middle frame 40.

Figure 4:
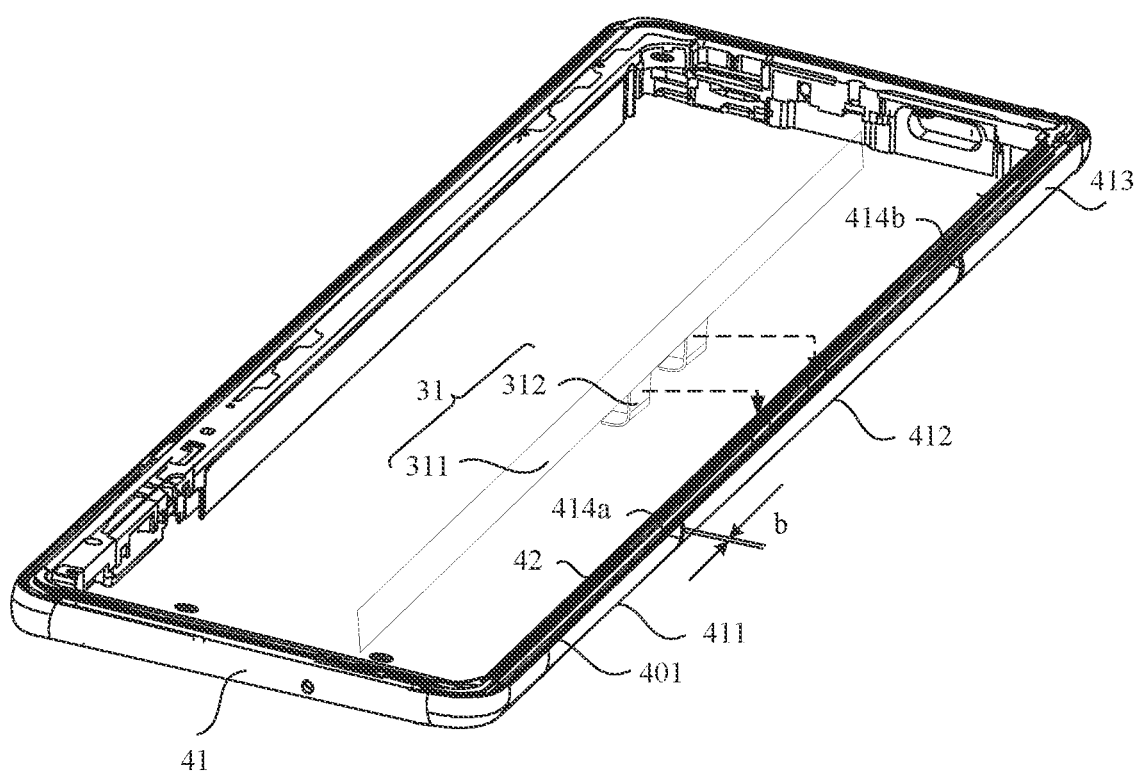
FIG. 4 is a schematic diagram of a split structure of a middle frame and an electrostatic protection structure of an electronic device according to an embodiment of this application.

In this embodiment of this application, as shown in FIG. 4, the outer metal frame 41 close to the electrostatic protection structure 31 may include a first metal frame 411, a second metal frame 412, and a third metal frame 413 that are separated from each other. The second metal frame 412 may be located between the first metal frame 411 and the third metal frame 413. The first metal frame 411 may be used as a first antenna radiator, and the third metal frame 413 may be used as a second antenna radiator. In other words, both the first metal frame 411 and the third metal frame 413 are antenna radiators, and the second metal frame 412 is not used as an antenna radiator.

When both the first metal frame 411 and the third metal frame 413 are antenna radiators, the second metal frame 412 is a metal material, and the metal material causes interference to radiation of the antenna radiators. Therefore, the first metal frame 411 and the second metal frame 412 are separated by a spacer 414a made of a non-conductive material, and the second metal frame 412 and the third metal frame 413 may be separated by a spacer 414b made of a non-conductive material. In this embodiment, a spacing width b between the spacer 414a and the spacer 414b may be greater than 0.8 mm. For example, a spacing between the first metal frame 411 and the second metal frame 412 may be 1 mm, and a spacing between the third metal frame 413 and the second metal frame 412 may be 0.9 mm. This ensures that the second metal frame 412 does not affect radiation of the first metal frame 411 and the third metal frame 413.

In addition, the electrostatic protection structure 31 is usually a metal layer. When the first metal frame 411 and the third metal frame 413 are antenna radiators, if the ground pin 312 of the electrostatic protection structure 31 is electrically connected to the first metal frame 411 and the third metal frame 413, the electrostatic protection structure 31 usually causes interference to the antenna radiators. Therefore, in this embodiment, as shown in FIG. 4, the ground pin 312 of the electrostatic protection structure 31 may be electrically connected to the second metal frame 412. In addition, when the ground pin 312 of the electrostatic protection structure 31 is electrically connected to the second metal frame 412, the ground pin 312 of the electrostatic protection structure 31 may be disposed away from the first metal frame 411 and the third metal frame 413. In this way, the electrostatic protection structure 31 prevents the static electricity and avoids interference to the antenna radiators.

Therefore, in this embodiment of this application, the electrostatic protection structure 31 is disposed to guide the static electricity on the display 20 to the middle frame 40 for grounding, and an electrostatic protection measure is taken on the display 20 and an electronic component on the circuit board 22. According to the technical solutions in this application, a process is simple, a higher electrostatic risk can be withstood, and reliability is higher. In addition, according to the technical solutions in this application, impact of the electrostatic protection structure 31 on an antenna radio frequency signal can be further avoid. This is more in line with light and thin development of a product like a mobile phone.

In this embodiment of this application, when the first metal frame 411 and the third metal frame 413 are used as antenna radiators, a specific clearance is usually required for the antenna radiators. In other words, a specific distance between a metal around each of the first metal frame 411 and the third metal frame 413 and each of the first metal frame 411 and the third metal frame 413 needs to be met. However, in this embodiment, the guide part 311 of the electrostatic protection structure 31 is disposed along extension directions of the first metal frame 411, the second metal frame 412, and the third metal frame 413. Therefore, when a distance between the guide part 311 of the electrostatic protection structure 31 and each of the first metal frame 411 and the third metal frame 413 is short, the guide part 311 of the electrostatic protection structure 31 affects radiation of the first metal frame 411 and the third metal frame 413.

Figure 5:
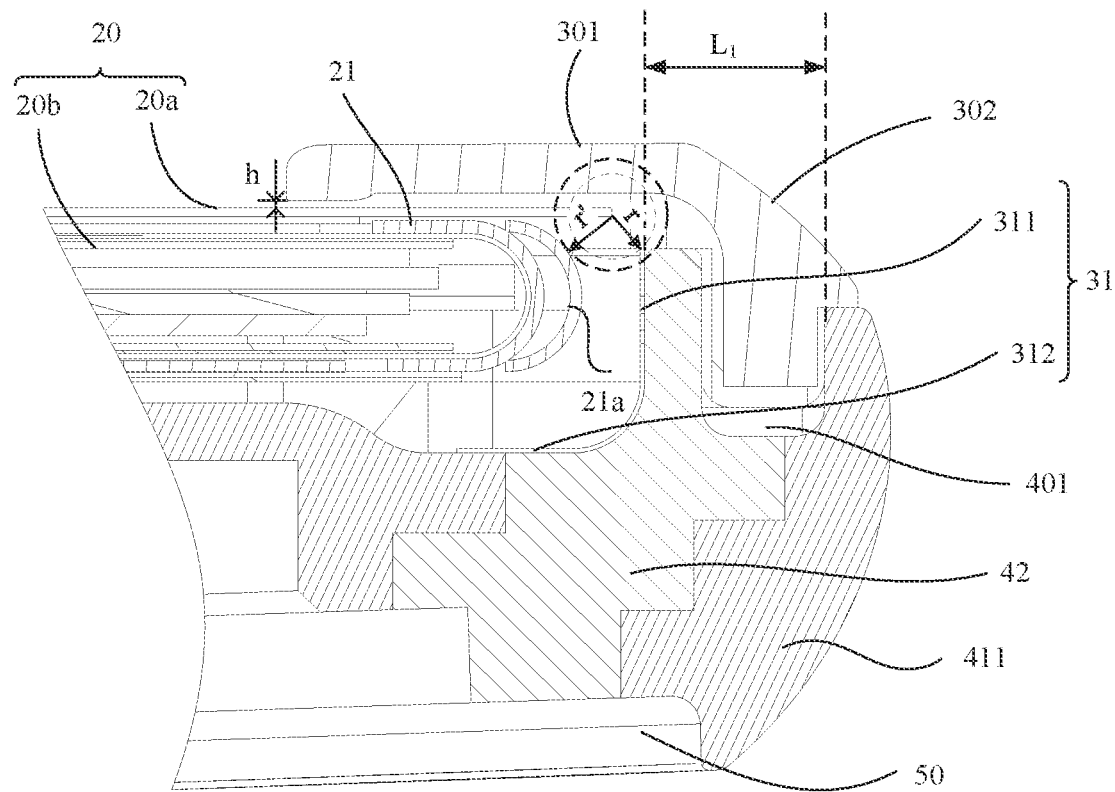
FIG. 5 is a partial sectional view of a side of an electronic device in which an electrostatic protection structure is disposed when the electronic device is cut along a B-B direction in FIG. 1.

To reduce or avoid impact of the guide part 311 of the electrostatic protection structure 31 on the radiation of the first metal frame 411 and the third metal frame 413, as shown in FIG. 5, a shortest distance $L_1$ between the guide part 311 of the electrostatic protection structure 31 and the first metal frame 411 is greater than 0.8 mm. Correspondingly, a shortest distance between the guide part 311 of the electrostatic protection structure 31 and the third metal frame 413 is also greater than 0.8 mm. This ensures that the electrostatic protection structure 31 is located outside the clearance between the first metal frame 411 and the third metal frame 413, and therefore there is a specific clearance when the first metal frame 411 and the third metal frame 413 are used as antenna radiators.

It should be noted that the distance between the guide part 311 of the electrostatic protection structure 31 and each of the first metal frame 411 and the third metal frame 413 does not constitute a limitation on the protection scope of the technical solutions in this application. For terminals of different models and different types, the distance is, but is not limited to be, greater than 0.8 mm, and may alternatively be greater than 1 mm, 2 mm, or the like, provided that the guide part 311 of the electrostatic protection structure 31 does not affect the radiation of the first metal frame 411 and the third metal frame 413. The distance may be set based on a specific case.

In this embodiment, the first metal frame 411, the second metal frame 412, and the third metal frame 413 are usually formed as a whole through nano-injection molding. During the nano-injection molding, plastic is injected into the spacing between the second metal frame 412 and each of the first metal frame 411 and the third metal frame 413 to form the spacer 414a and the spacer 414b. After the nano-injection molding, the inner insulation frame 42 (for example, a plastic frame) is formed on inner sides of the first metal frame 411, the second metal frame 412, and the third metal frame 413. Therefore, in this embodiment of this application, the inner insulation frame 42, the spacer 414a, and the spacer 414b are integrally formed.

In this embodiment of this application, because the inner insulation frame 42 is usually made of a plastic material, it is less difficult to open a groove or a hole on the inner insulation frame 42 than to open a groove or a hole on an inner wall of the outer metal frame. In this way, the inner insulation frame 42 is disposed, to facilitate fastening between components in the mobile phone and middle frame 40.

It should be noted that, in this embodiment, frames used as antenna radiators include, but are not limited to, the first metal frame 411 and the second metal frame 412. For example, in some examples, the first metal frame 411 and the second metal frame 412 may alternatively be used as antenna radiators, and the ground pin 312 of the electrostatic protection structure 31 may be electrically connected to the third metal frame 413. Alternatively, the second metal frame 412 and the third metal frame 413 may be used as antenna radiators, and the ground pin 312 of the electrostatic protection structure 31 may be electrically connected to the first metal frame 411.

It should be noted that, in this embodiment, a quantity of antenna radiators is not limited to two, and may alternatively be one, three, four, or the like, provided that the antenna radiator can meet signal receiving and transmission requirements of the electronic device.

Figure 6:
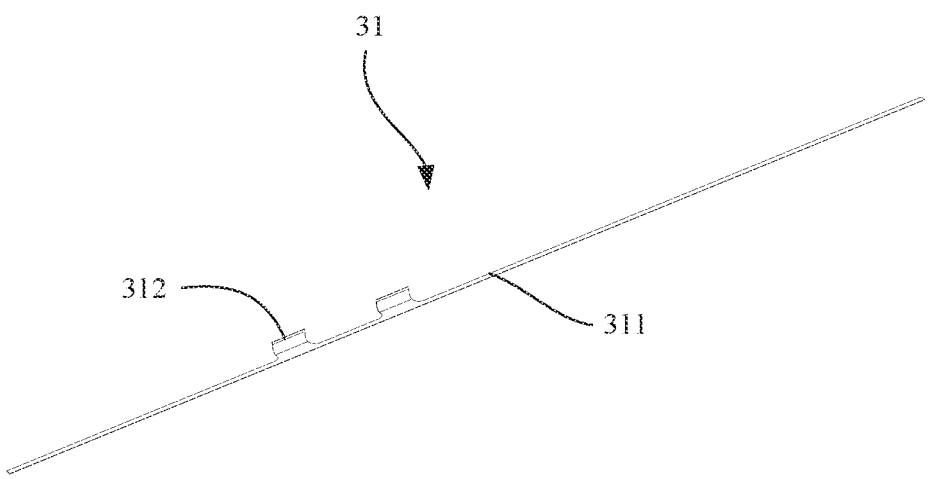
FIG. 6 is a schematic diagram of a structure of an electrostatic protection structure according to an embodiment of this application.
Figure 7:
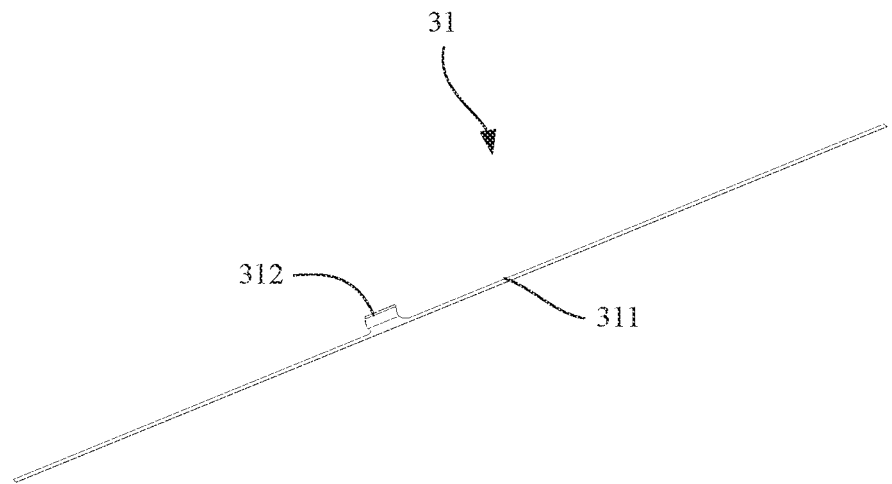
FIG. 7 is a schematic diagram of another structure of an electrostatic protection structure according to an embodiment of this application.

In this embodiment of this application, as shown in FIG. 6, there may be one ground pin 312 of the electrostatic protection structure 31, and a shape of the ground pin 312 includes, but is not limited to, structures shown in FIG. 6 and FIG. 7. In this application, as shown in FIG. 7, there may be one ground pin 312. The ground pin 312 is connected to the guide part 311, and extends along the insulation top cover 30 toward a side away from the guide part 311. In this way, one ground pin 312 is disposed to implement the electrical connection between the electrostatic protection structure 31 and the middle frame 40, and a size of the ground pin 312 is small, so that materials can be reduced. In addition, a position of the ground pin 312 may be flexibly set based on a position of the middle frame 40, to facilitate a connection between the ground pin 312 and the middle frame 40, and avoid impact of the electrostatic protection structure 31 on the antenna radiator.

Figure 8:
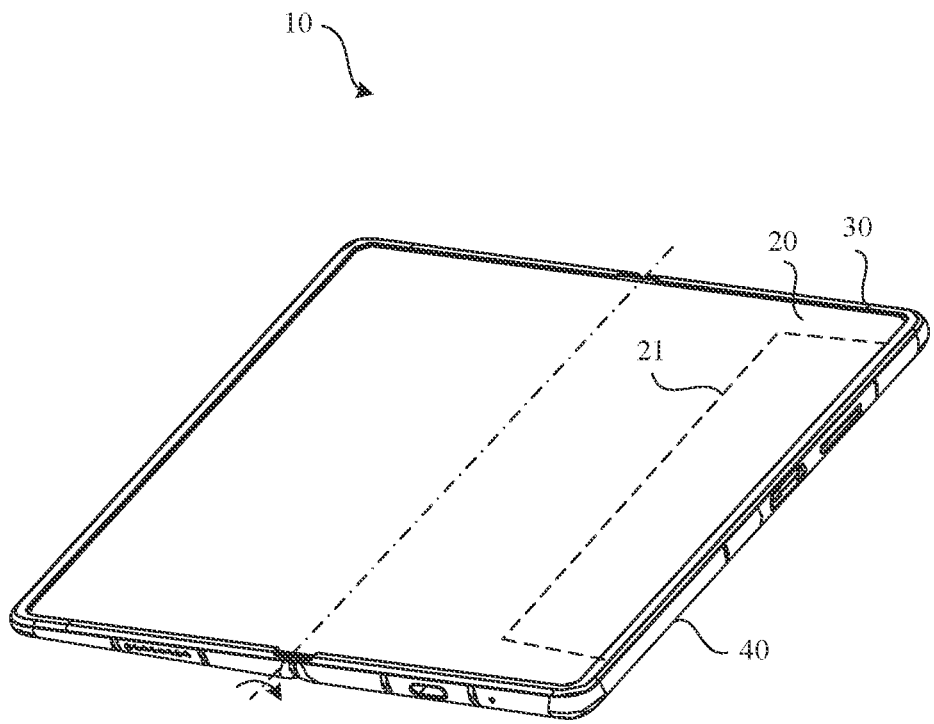
FIG. 8 is a schematic diagram of a three-dimensional structure of an electronic device according to an embodiment of this application.
Figure 9:
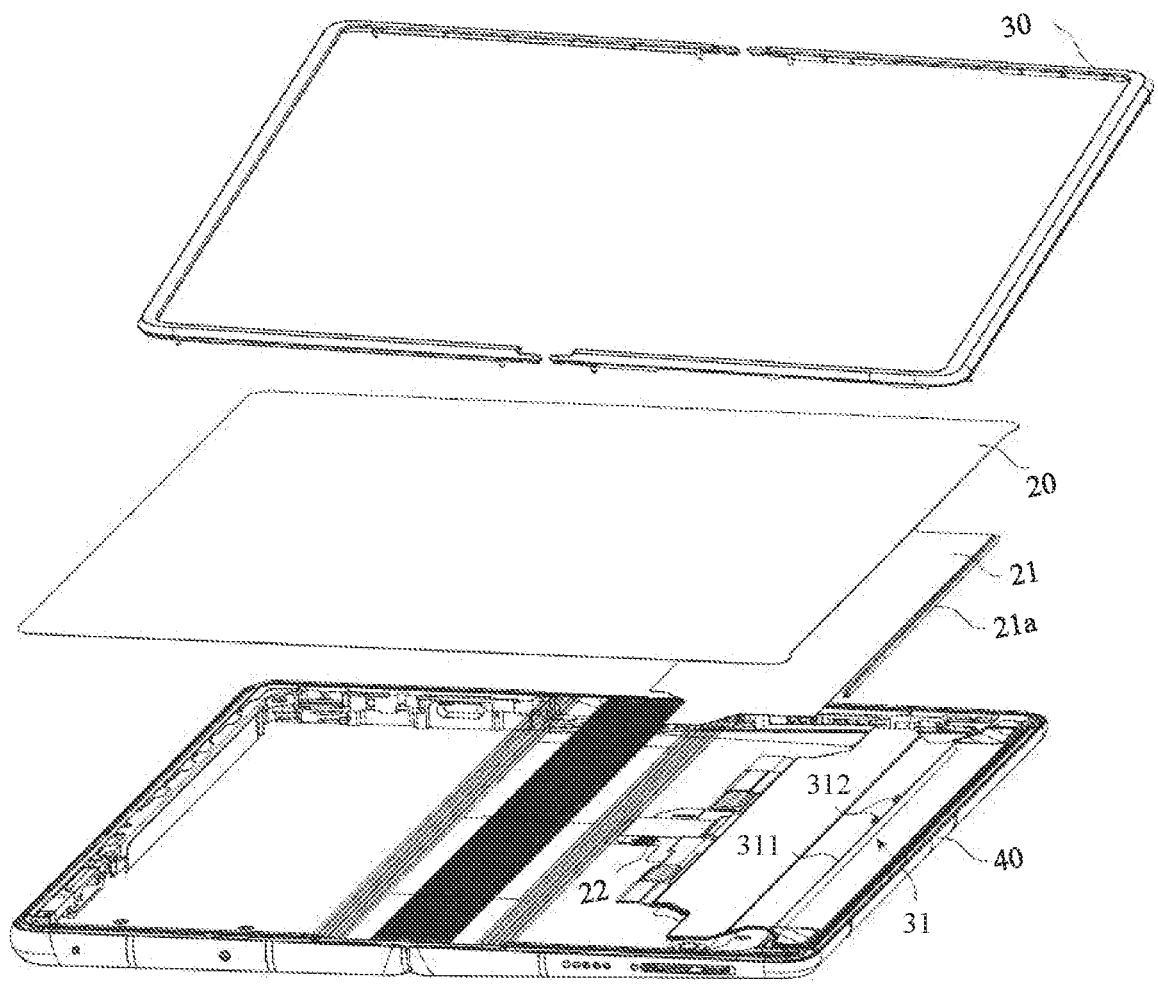
FIG. 9 is an exploded view of FIG. 8.

Different from the foregoing scenario, in this scenario, the foregoing solution may be applied to a foldable device. As shown in FIG. 8, the mobile phone 10 is a foldable phone that is folded inward. As shown in FIG. 8 and FIG. 9, the mobile phone 10 may include the display 20, the insulation top cover 30, the middle frame 40, and the flexible printed circuit 21. The flexible printed circuit 21 is located on a side of the mobile phone 10. For details, refer to a dashed-line part in FIG. 8. The flexible printed circuit 21 is disposed close to a side of the middle frame 40. One end of the flexible printed circuit 21 is electrically connected to a side of the display 20, and the other end of the flexible printed circuit 21 is electrically connected to a circuit board 22 (as shown in FIG. 9) of the mobile phone 10. The flexible printed circuit 21 has the bending region 21a, and the electrostatic protection structure 31 is located on an inner surface that is of the middle frame 40 and that is close to the bending region 21a of the flexible printed circuit 21. For a structure and an arrangement manner of the electrostatic protection structure 31, refer to the descriptions in the scenario 1, and details are not described in this scenario again.

Different from the foregoing scenario, in this scenario, because the mobile phone needs to be folded, the insulation top cover 30 includes a left part and a right part, and the left part and the right part of the insulation top cover 30 may be connected through a flexible connecting piece. The middle frame 40 includes a left middle frame and a right middle frame, and the left middle frame and the right middle frame are hinged by using a hinge structure.

Scenario 2

Figure 10:
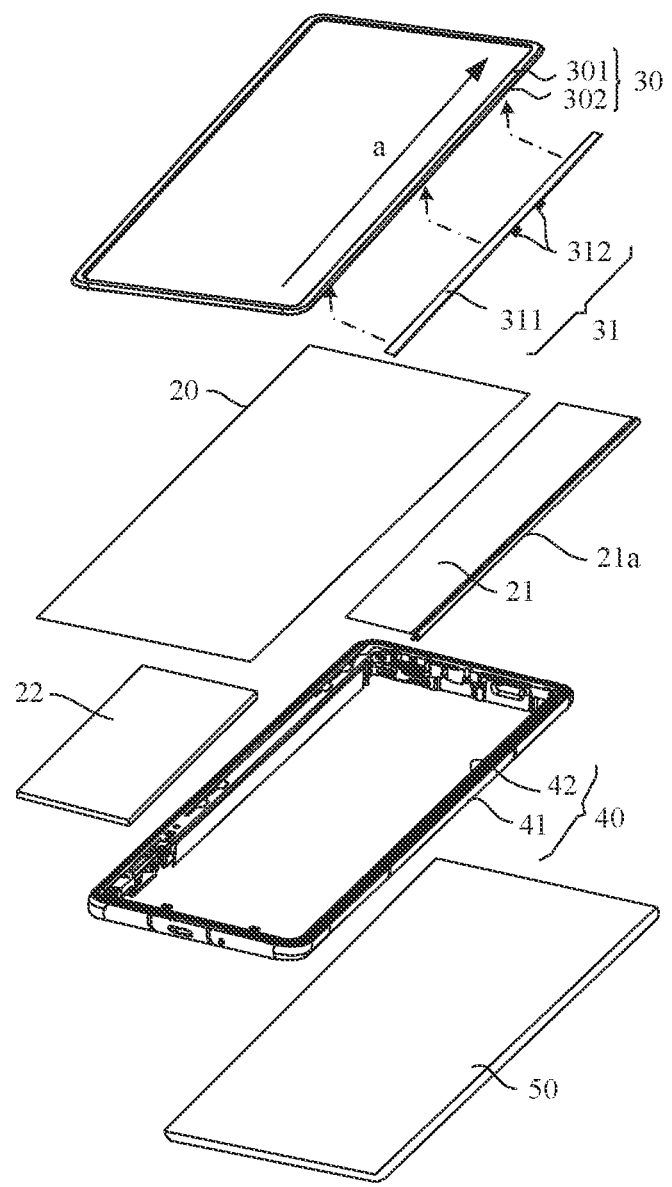
FIG. 10 is a schematic diagram of an exploded structure of an electronic device according to an embodiment of this application.
Figure 11:
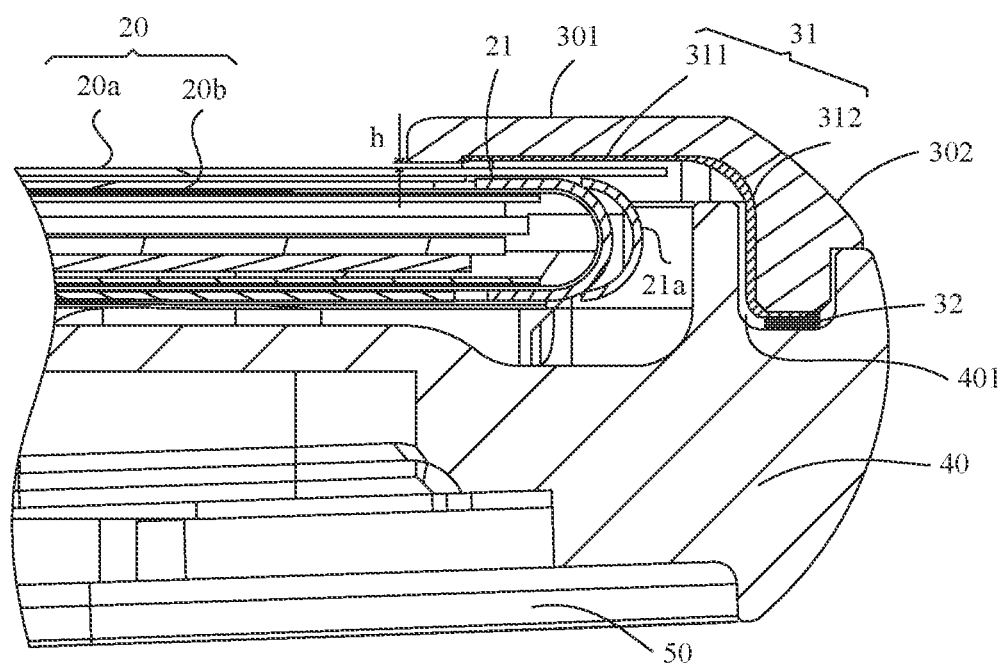
FIG. 11 is a partial sectional view of a side of an electronic device in which an electrostatic protection structure is disposed when the electronic device provided in FIG. 10 is cut along an A-A direction in FIG. 1.

In this scenario, as shown in FIG. 10, the electrostatic protection structure 31 may be disposed on an inner surface that is of the insulation top cover 30 and that corresponds to the flexible printed circuit 21. As shown in FIG. 11, one end of the electrostatic protection structure 31 is close to an open end of the gap h between the insulation top cover 30 and the display 20, and the other end of the electrostatic protection structure 31 extends toward the middle frame 40 and is electrically connected to the middle frame 40 to implement discharge.

The bending region 21a of the flexible printed circuit 21 is disposed close to a side of the middle frame 40. For example, the bending region 21a of the flexible printed circuit 21 is disposed close to a right frame of the middle frame 40 (as shown in FIG. 10). Therefore, when the electrostatic protection structure 31 is disposed on the inner surface of the insulation top cover 30, the electrostatic protection structure 31 may be disposed on the inner surface that is of the insulation top cover 30 and that is close to the bending region 21a of the flexible printed circuit 21. For example, the electrostatic protection structure 31 may be disposed on a right inner surface of the insulation top cover 30 along the length direction a (namely, the width direction of the flexible printed circuit 21) of the insulation top cover 30 in FIG. 2. In this way, the electrostatic protection structure 31 can protect the bending region 21a of the flexible printed circuit 21, and prevent the bending region 21a of the flexible printed circuit 21 from being damaged due to discharge of the static electricity in the bending region 21a of the flexible printed circuit 21.

In this embodiment of this application, as shown in FIG. 11, the guide part 311 of the electrostatic protection structure 31 may be disposed by extending along the length direction a (as shown in FIG. 10) of the insulation top cover 30 on the inner surface of the insulation top cover 30. As shown in FIG. 11, the guide part 311 may be disposed on an inner surface that is of the suspended part 301 of the insulation top cover 30 and that corresponds to the flexible printed circuit 21, the ground pin 312 may be disposed on an inner surface of the connecting part 302, and an end of the ground pin 312 is electrically connected to a metal frame of the middle frame 40.

In this embodiment of this application, when the electrostatic protection structure 31 is electrically connected to the middle frame 40 through the ground pin 312, as shown in FIG. 11, the ground pin 312 may be electrically connected to the middle frame 40 through conductive glue 32. Alternatively, in some examples, the ground pin 312 may be electrically connected to the middle frame 40 through conductive foam or a conductive spring.

In this embodiment of this application, as shown in FIG. 10 and FIG. 11, an assembly groove 401 is provided at an end that is of the middle frame 40 and that faces the insulation top cover 30, and an end of the connecting part 302 of the insulation top cover 30 is located in the assembly groove 401. The end of the ground pin 312 extends into the assembly groove 401 along with the connecting part 302, and the conductive glue 32 is located in the assembly groove 401. It should be noted that a groove bottom of the assembly groove 401 in which the conductive glue 32 is provided is made of a metal material, so that the ground pin 312 is electrically connected to the middle frame 40 through the conductive glue 32. In this embodiment, an adhesive layer may be provided between the end of the connecting part 302 of the insulation top cover 30 and the assembly groove 401 of the middle frame 40, to implement a connection between the insulation top cover 30 and the middle frame 40.

Figure 12:
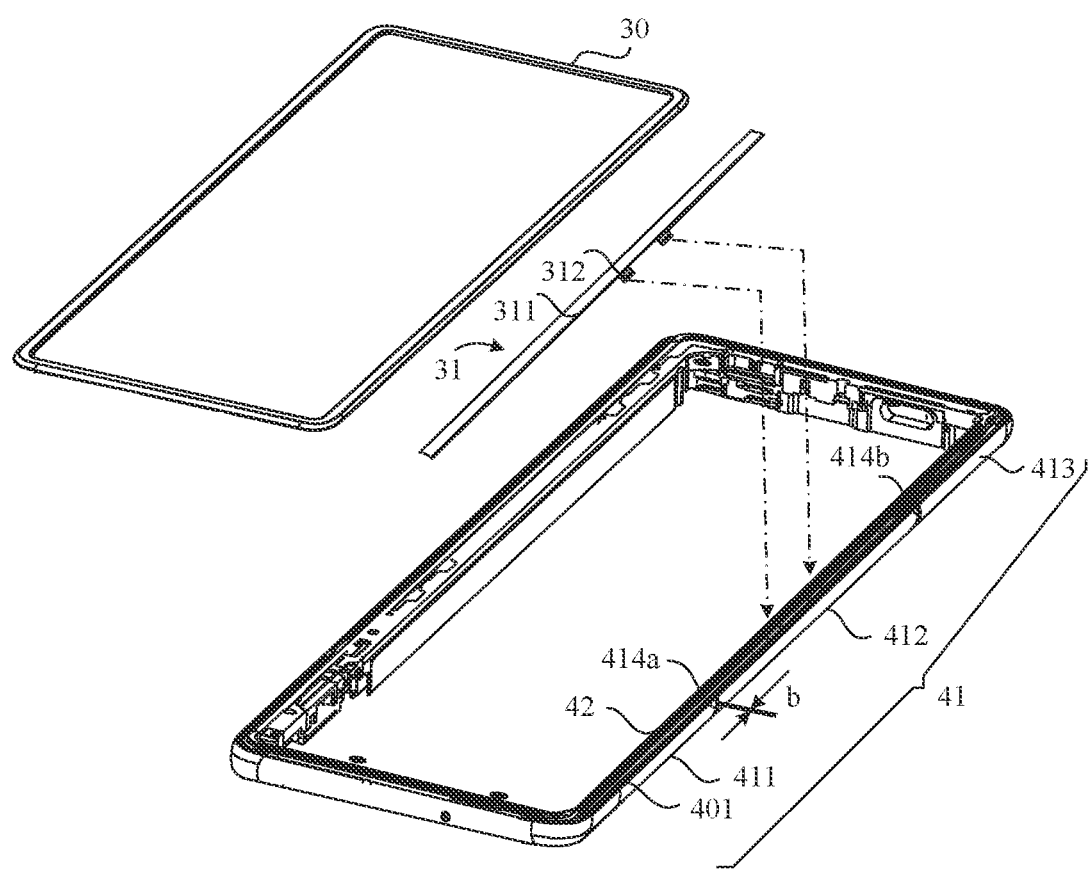
FIG. 12 is a schematic diagram of a split structure of a middle frame and an electrostatic protection structure of an electronic device according to an embodiment of this application.

In this embodiment of this application, as shown in FIG. 12, the first metal frame 411 and the third metal frame 413 may be antenna radiators, and therefore the ground pin 312 of the electrostatic protection structure 31 may be electrically connected to the second metal frame 412. In this way, the electrostatic protection structure 31 prevents static electricity and avoids interference to the antenna radiators.

Therefore, in this embodiment of this application, the electrostatic protection structure 31 is disposed to guide the static electricity on the display 20 to the middle frame 40 for grounding, and an electrostatic protection measure is taken on the display 20 and an electronic component on the circuit board 22. According to the technical solutions in this application, a process is simple, a higher electrostatic risk can be withstood, and reliability is higher. In addition, according to the technical solutions in this application, impact of the electrostatic protection structure 31 on an antenna radio frequency signal can be further avoid. This is more in line with light and thin development of a product like a mobile phone.

Figure 13:
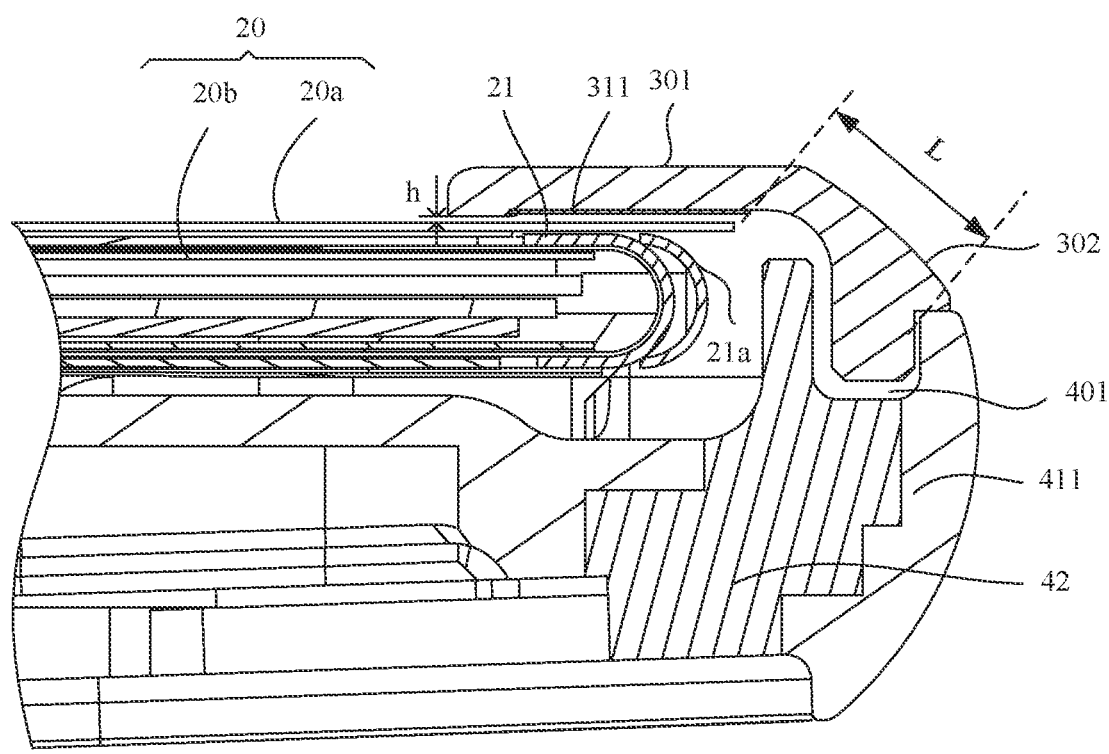
FIG. 13 is a partial sectional view of a side of an electronic device in which an electrostatic protection structure is disposed when the electronic device provided in FIG. 10 is cut along a B-B direction in FIG. 1.

In this embodiment of this application, when the electrostatic protection structure 31 is disposed on the inner surface of the insulation top cover 30, to reduce or avoid impact of the guide part 311 of the electrostatic protection structure 31 on radiation of the first metal frame 411 and the third metal frame 413, a distance between the guide part 311 of the electrostatic protection structure 31 and each of the first metal frame 411 and the third metal frame 413 is greater than 0.8 mm. For example, as shown in FIG. 13, a shortest distance L between the guide part 311 of the electrostatic protection structure 31 and the first metal frame 411 is greater than 0.8 mm. Correspondingly, a shortest distance between the guide part 311 of the electrostatic protection structure 31 and the third metal frame 413 is also greater than 0.8 mm. This ensures that the guide part 311 of the electrostatic protection structure 31 is located outside a clearance between the first metal frame 411 and the third metal frame 413, and therefore there is a specific clearance when the first metal frame 411 and the third metal frame 413 are used as antenna radiators.

It should be noted that the distance between the guide part 311 of the electrostatic protection structure 31 and each of the first metal frame 411 and the third metal frame 413 does not constitute a limitation on the protection scope of the technical solutions in this application. For terminals of different models and different types, the distance is, but is not limited to be, greater than 0.8 mm, and may alternatively be greater than 1 mm, 2 mm, or the like, provided that the guide part 311 of the electrostatic protection structure 31 does not affect the radiation of the first metal frame 411 and the third metal frame 413. The distance may be set based on a specific case.

In this scenario, for specific arrangement manners and structures of the first metal frame 411, the second metal frame 412, and the third metal frame 413, refer to the foregoing scenario, and details are not described in this scenario again.

It should be noted that, in this embodiment of this application, the foregoing solution may also be applied to the foldable phone shown in FIG. 8 and FIG. 9. For an arrangement manner, refer to the foregoing descriptions.

Scenario 3

Figure 14:
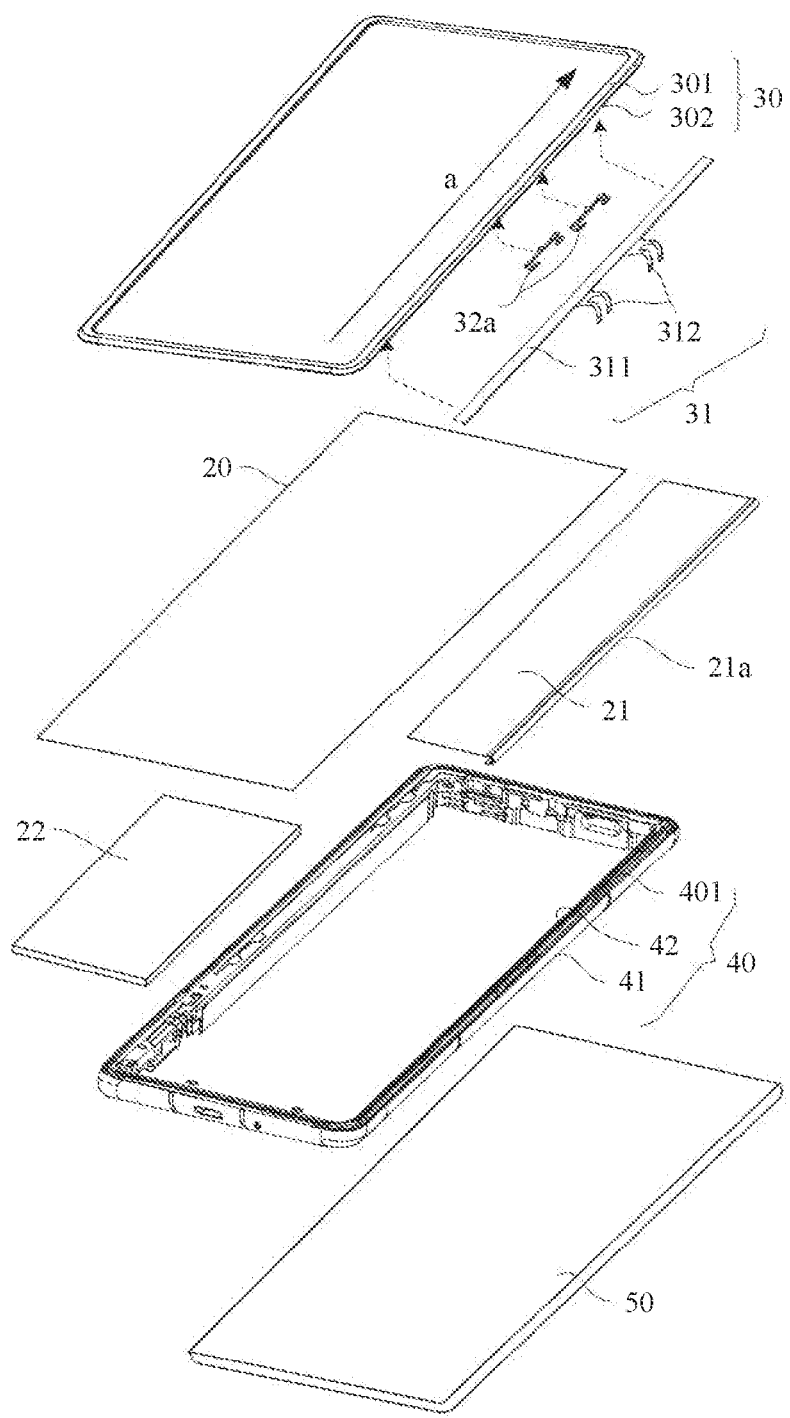
FIG. 14 is a schematic diagram of an exploded structure of an electronic device according to an embodiment of this application.

In this scenario, the ground pin 312 of the electrostatic protection structure 31 is electrically connected to the middle frame 40 through a conductive spring. For example, as shown in FIG. 14, the mobile phone 10 further includes at least one conductive spring 32a. For example, in FIG. 14, there may be two conductive springs. In this way, the two conductive springs 32a is disposed, so that the two ground pins 312 of the electrostatic protection structure 31 are separately electrically connected to the middle frame 40. In this embodiment, a quantity of conductive springs 32a may be consistent with a quantity of ground pins 312 of the electrostatic protection structure 31.

Figure 15:
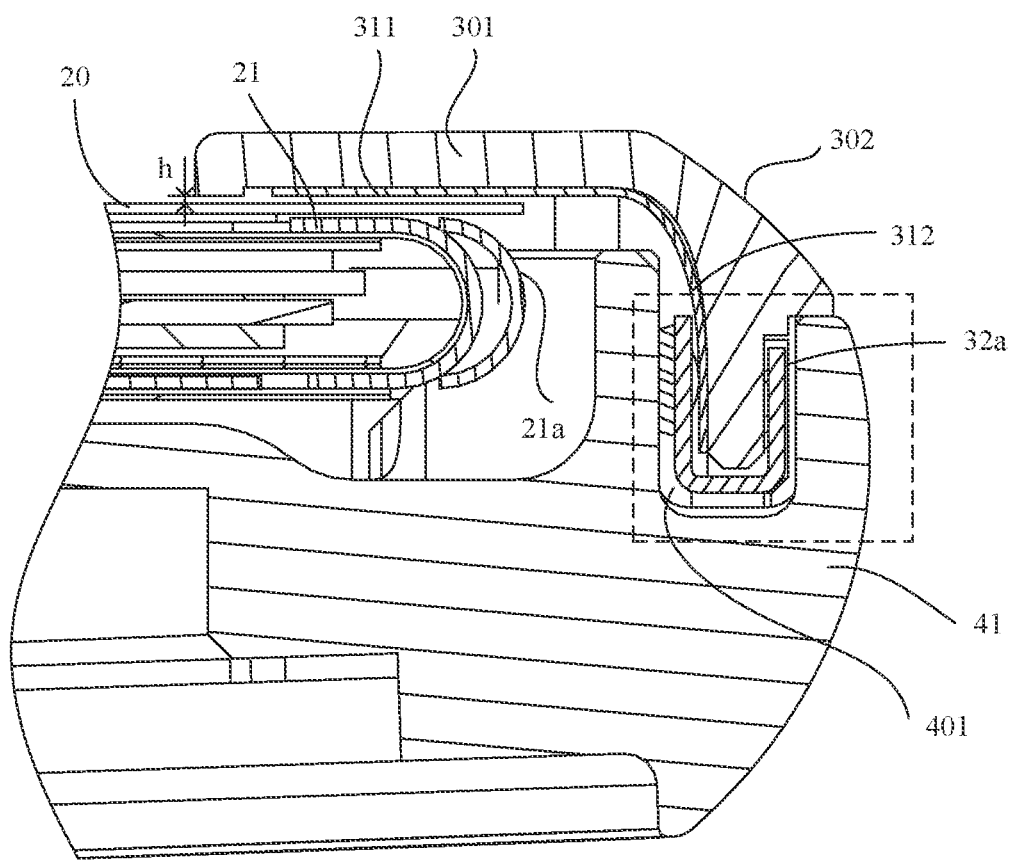
FIG. 15 is a partial sectional view of a side of an electronic device in which an electrostatic protection structure is disposed when the electronic device provided in FIG. 14 is cut along an A-A direction in FIG. 1.
Figure 16:
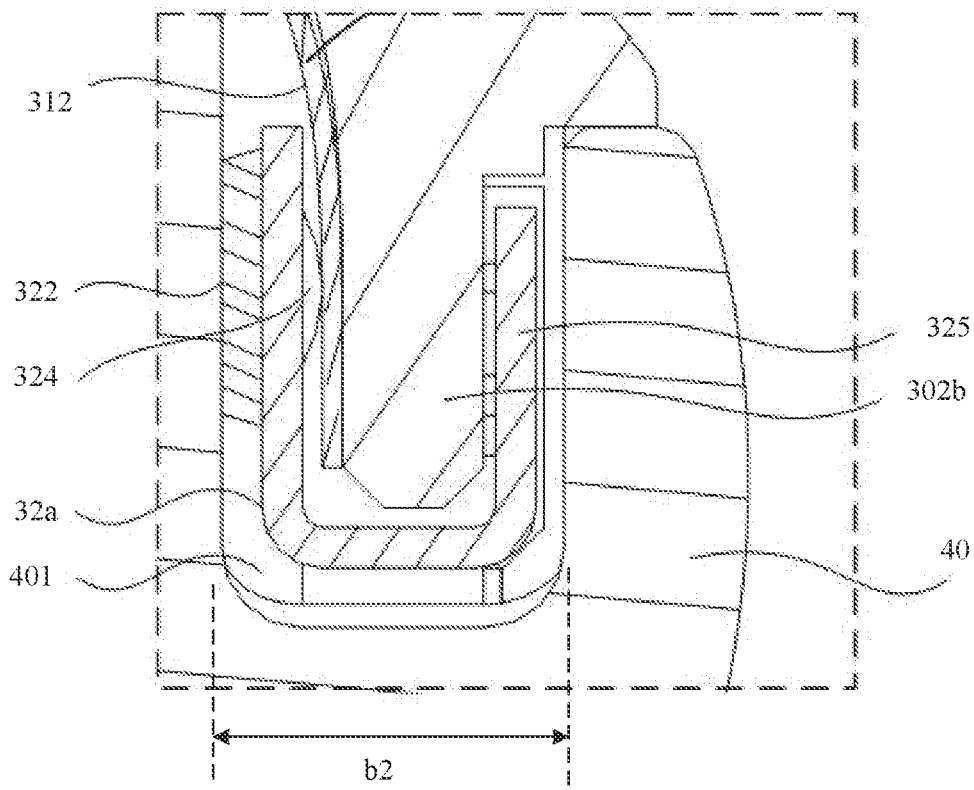
FIG. 16 is an enlarged schematic diagram of a dashed box in FIG. 15.

In this embodiment of this application, the conductive spring 32a is fastened to an end of the connecting part 302 of the insulation top cover 30, and the conductive spring 32a is in electrical contact with the ground pin 312 disposed in the insulation top cover 30. As shown in FIG. 15 and FIG. 16, the conductive spring 32a, the end of the connecting part 302 of the insulation top cover 30, and a part of the ground pin 312 are located in the assembly groove 401 of the middle frame 40, and the conductive spring 32a is in electrical contact with the outer metal frame 41 of the middle frame 40. In this way, static electricity is transferred to the ground pin 312 along the guide part 311 of the electrostatic protection structure 31, and the ground pin 312 transfers the static electricity to the outer metal frame 41 of the middle frame 40 through the conductive spring 32a to implement discharge, to prevent the flexible printed circuit 21 from being damaged due to discharge of the static electricity in the bending region 21a of the flexible printed circuit 21.

After assembly is completed, as shown in FIG. 16, it is ensured that a first abutting part 322 (refer to the following descriptions in FIG. 17 to FIG. 19) closely abuts against an inner wall of the assembly groove 401 of the middle frame 40 under an action of an elastic force of the conductive spring 32a. In addition, a reaction force of the inner wall of the assembly groove 401 of the middle frame 40 on the first abutting part 322 enables a second abutting part 324 (refer to the following descriptions in FIG. 17 to FIG. 19) of the conductive spring 32a to be in close electrical contact with the ground pin 312.

In this embodiment, the conductive spring 32a is fixed on the connecting part 302 of the insulation top cover 30, so that the ground pin 312 of the electrostatic protection structure 31 can be electrically connected to the outer metal frame 41 after the insulation top cover 30 is assembled with the middle frame 40. This avoids problems of complicated assembly and low assembly efficiency caused by the electrical connection between the ground pin 312 of the electrostatic protection structure 31 and the middle frame 40 through re-assembly.

In addition, in this embodiment of this application, the conductive spring 32a has specific elasticity. Therefore, after the assembly is completed, the elastic force of the conductive spring 32a ensures that the conductive spring 32a closely abuts against the inner wall of the assembly groove 401 of the middle frame 40. This ensures that the ground pin 312 of the electrostatic protection structure 31 is well electrically connected to the outer metal frame 41 through the conductive spring 32a, to avoid a problem that the ground pin 312 cannot be electrically connected to the outer metal frame 41 due to problems such as looseness or aging between the ground pin 312 of the electrostatic protection structure 31 and the outer metal frame 41.

Therefore, in this embodiment of this application, the ground pin 312 of the electrostatic protection structure 31 can be well electrically connected to the outer metal frame 41 through the conductive spring 32a. In addition, a simple structure, convenient installation, and reliable connection of conductive spring 32a facilitates quantitative production, and is beneficial to large-scale production of the mobile phone 10.

Figure 17:
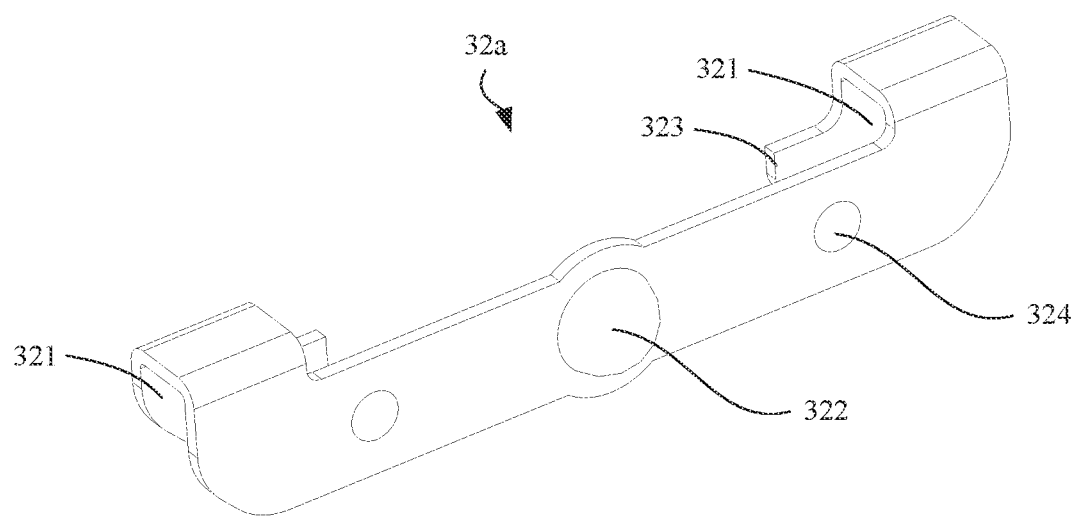
FIG. 17 is a schematic diagram of a structure of a conductive spring according to an embodiment of this application.
Figure 18:
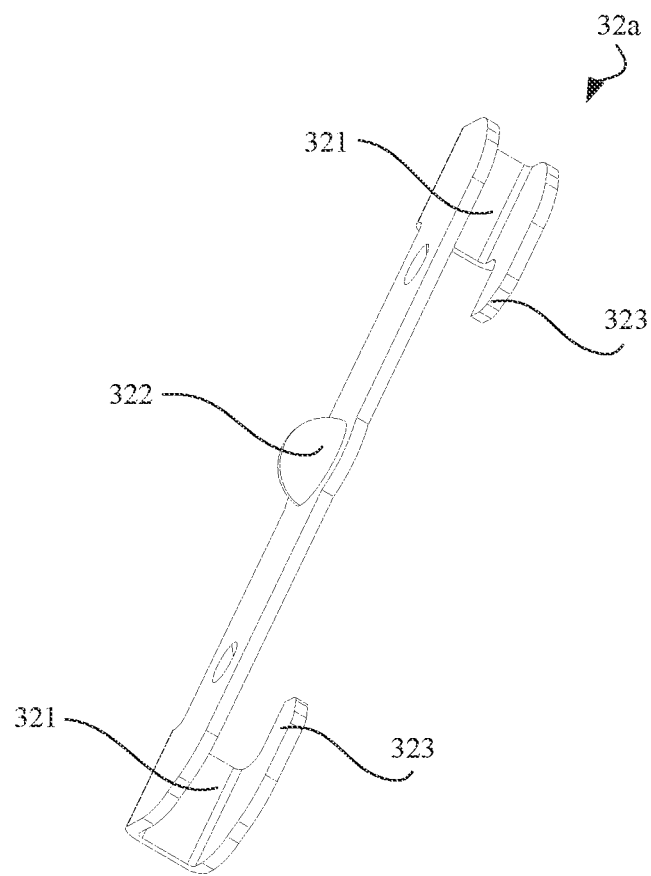
FIG. 18 is a schematic diagram of a structure of the conductive spring in FIG. 17 from another angle according to this application.

In this embodiment of this application, as shown in FIG. 17 and FIG. 18, the conductive spring 32a has at least one clamping part 321, and the conductive spring 32a is clamped on the connecting part 302 of the insulation top cover 30 through the clamping part 321. In this embodiment of this application, as shown in FIG. 17, the conductive spring 32a has two clamping parts 321, and the two clamping parts 321 are respectively located at two ends of the conductive spring 32a In this embodiment of this application, the clamping part 321 may be a clamping groove shown in FIG. 17, and an end of the connecting part 302 of the insulation top cover 30 is clamped in the clamping groove. In this embodiment of this application, the clamping part 321 may be a "U"-shaped groove, and the "U"-shaped groove may be formed by enclosing a clamping side wall 325. Certainly, in some other examples, the clamping part 321 may alternatively be another clamping member clamped on the connecting part 302 of the insulation top cover 30.

Figure 26:
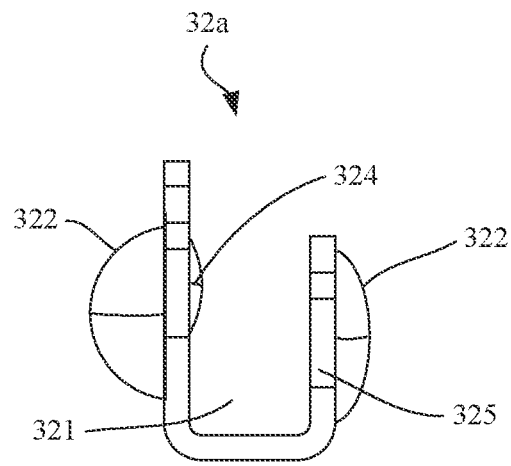
FIG. 26 is a side view of a conductive spring according to an embodiment of this application.

In this embodiment of this application, because the conductive spring 32a is in electrical contact with the ground pin 312 disposed in the insulation top cover 30, to implement close electrical contact between the conductive spring 32a and the outer metal frame, as shown in FIG. 17, the conductive spring 32a has at least one first abutting part 322. For example, in FIG. 17, there is one first abutting part 322. In another example, there may be two or more first abutting parts 322 (as shown in FIG. 26 below). In this embodiment of this application, the first abutting part 322 is configured to abut against the inner wall of the assembly groove 401 of the middle frame 40 (as shown in FIG. 16), so that the conductive spring 32a is in closer electrical contact with the outer metal frame of the middle frame 40, and then the conductive spring 32a can be well electrically connected to the outer metal frame.

It should be noted that a part that is of the assembly groove 401 and that is connected to the conductive spring 32a is made of a metal material. Therefore, provided that the conductive spring 32a is connected to a side wall of the assembly groove 401, the electrostatic protection structure 31 can be electrically connected to the middle frame 40.

An outer surface of the first abutting part 322 may be an arc surface that protrudes outward. For example, the outer surface of the first abutting part 322 may be a spherical surface. In this way, assembly between the outer surface of the first abutting part 322 and the assembly groove 401 is easier during assembly. Certainly, in some other examples, the outer surface of the first abutting part 322 may alternatively be set as a flat surface.

Figure 19:
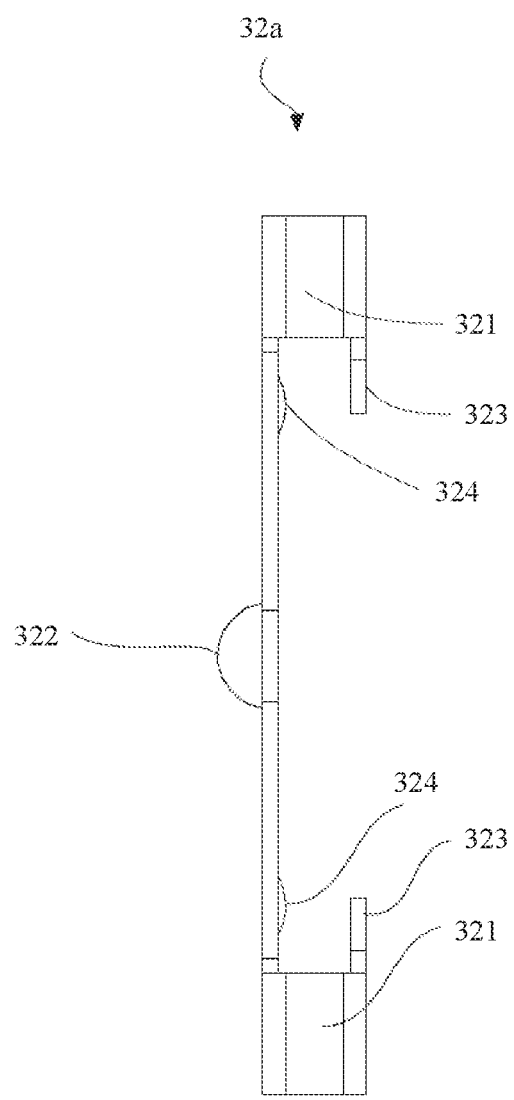
FIG. 19 is a front view of the conductive spring in FIG. 18.

In this embodiment of this application, as shown in FIG. 19, the conductive spring 32a has at least one second abutting part 324. For example, in FIG. 19, there are two second abutting parts 324. Certainly, in some examples, there may be one or more second abutting parts 324. The second abutting part 324 is configured to be in electrical contact with the ground pin 312 of the electrostatic protection structure 31 (as shown in FIG. 16), so that when the ground pin 312 of the electrostatic protection structure 31 is disposed on the inner surface of the insulation top cover 30, and the conductive spring 32a is clamped on the connecting part 302 of the insulation top cover 30, the second abutting part 324 of the conductive spring 32a is in close electrical contact with the ground pin 312 of the electrostatic protection structure 31, and then the conductive spring 32a is well electrically connected to the ground pin 312.

In this embodiment of this application, as shown in FIG. 19, an outer surface of the second abutting part 324 may be an arc surface that protrudes outward. For example, the outer surface of the second abutting part 324 may be a spherical surface.

It should be noted that shapes of the first abutting part 322 and the second abutting part 324 are not limited to spherical shapes shown in the figure, and may alternatively be another shape, like oval, rectangular, triangular, or trapezoidal, provided that the first abutting part 322 and the second abutting part 324 can be reliably electrically connected to the electrostatic protection structure 31 and the middle frame 40.

Figure 20:
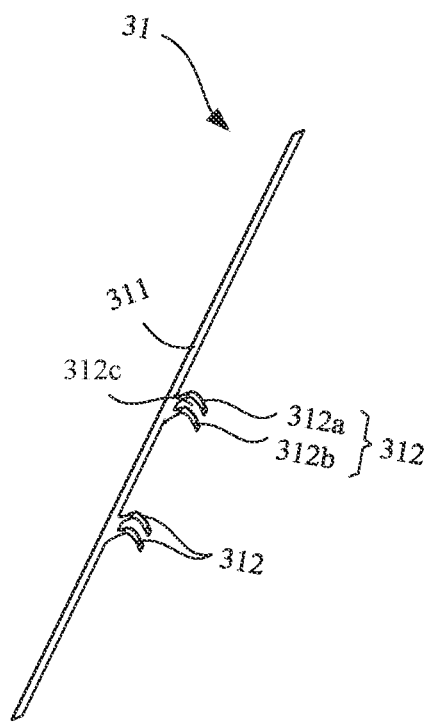
FIG. 20 is a schematic diagram of a structure of an electrostatic protection structure according to an embodiment of this application.

In this embodiment of this application, each ground pin 312 may include two sub-pins. For example, as shown in FIG. 20, each ground pin 312 includes two sub-pins, the two sub-pins are disposed in parallel, and the two sub-pins are respectively a sub-pin 312a and a sub-pin 312b. There is a spacing 312c between the sub-pin 312a and the sub-pin 312b. The spacing 312c may avoid compression deformation of the conductive spring 32a. For details, refer to the descriptions in FIG. 28.

It should be noted that the ground pin 312 is designed to a structure including two sub-pins, to ensure that a reliable electrical connection to the conductive spring 32a is implemented by using the other sub-pin when one of the sub-pins is disconnected from the conductive spring 32a, and ensure that the electrostatic protection structure 31 can be reliably electrically connected to the middle frame 40 through the conductive spring 32a In addition, a quantity of sub-pins does not constitute a limitation on the protection scope of the technical solutions in this application, provided that the ground pin 312 can be reliably electrically connected to the conductive spring 32a. A plurality of sub-pins may be disposed, or no sub-pin may be disposed.

In this embodiment of this application, because the inner surface of the connecting part 302 of the insulation top cover 30 is an arc-shaped transition, the ground pin 312 is a curved structure fitting with the arc-shaped inner surface of the connecting part 302. In this way, the electrostatic protection structure 31 is closely attached to the insulation top cover 30.

Figure 21:
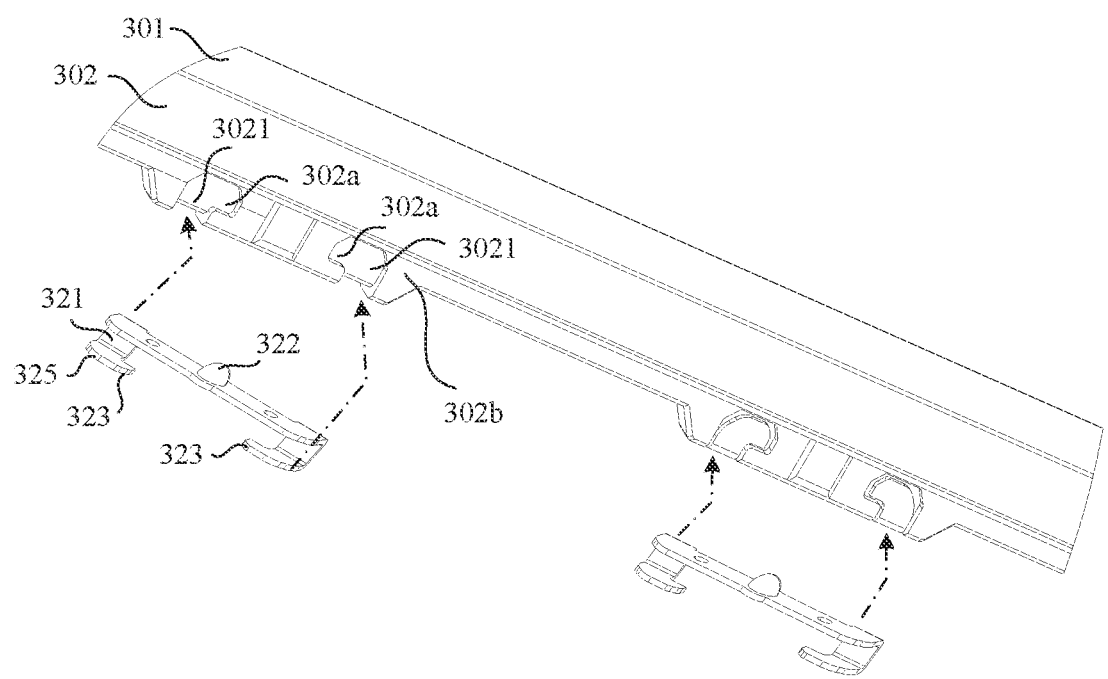
FIG. 21 is a schematic diagram of a structure of assembly between a conductive spring, an electrostatic protection structure, and an insulation top cover according to an embodiment of this application.

In this embodiment of this application, when the conductive spring 32a is assembled with the connecting part 302 of the insulation top cover 30, as shown in FIG. 21, an assembly end 302b is provided at an end that is of the connecting part 302 of the insulation top cover 30 and that faces the middle frame 40, and the conductive spring 32a is specifically clamped on the assembly end 302b of the connecting part 302.

To implement firm clamping between the conductive spring 32a and the assembly end 302b of the connecting part 302, as shown in FIG. 21, the conductive spring 32a has a position-limiting part 323, and a position-limiting slot 302a is provided on the assembly end 302b of the connecting part 302. In this way, when the two clamping parts 321 of the conductive spring 32a are clamped on the assembly end 302b of the connecting part 302, the position-limiting part 323 fits with the position-limiting slot 302a to prevent the conductive spring 32a from disconnecting from the assembly end 302b of the connecting part 302. Therefore, in this embodiment of this application, the position-limiting part 323 and the position-limiting slot 302a are disposed, to ensure that the conductive spring 32a is not easily disconnected after the conductive spring 32a is clamped on the assembly end 302b of the connecting part 302, and ensure that the conductive spring 32a keeps good electrical contact with the ground pin 312 of the electrostatic protection structure 31.

In this embodiment of this application, as shown in FIG. 21, the conductive spring 32a has a clamping part 321, the clamping part 321 includes the clamping side wall 325, and the position-limiting part 323 is disposed on the clamping side wall 325. The position-limiting part 323 may be a part of the clamping side wall 325, and the position-limiting part 323 is a hook-shaped structure formed by extending an end of the clamping side wall 325. In this embodiment, the position-limiting part 323 is disposed on the clamping side wall 325 of the clamping part 321. Certainly, the position-limiting part 323 may alternatively be disposed on a side wall opposite the clamping side wall 325. In addition, in this embodiment of this application, as shown in FIG. 21, the position-limiting part 323 is the hook-shaped structure formed by extending the end of the clamping side wall 325. Therefore, w % ben the clamping part 321 of the conductive spring 32a is clamped, to facilitate close clamping between the clamping side wall and a surface of the assembly end 302b of the connecting part 302, an accommodating groove 3021 communicating with the position-limiting slot 302a may be provided on the assembly end 302b of the connecting part 302. In this way, when the conductive spring 32a is clamped on the assembly end 302b, the clamping side wall 325 of the conductive spring 32a is located in the accommodating groove 3021, and the position-limiting part 323 is located in the position-limiting slot 302a.

It should be noted that a shape and a position of the position-limiting part 323 include, but are not limited to, the descriptions in the foregoing embodiment, provided that the position-limiting part can play a position-limiting role on the conductive spring 32a. A specific shape of the position-limiting part 323 may be set based on a specific case, and details are not described herein again.

Figure 22:
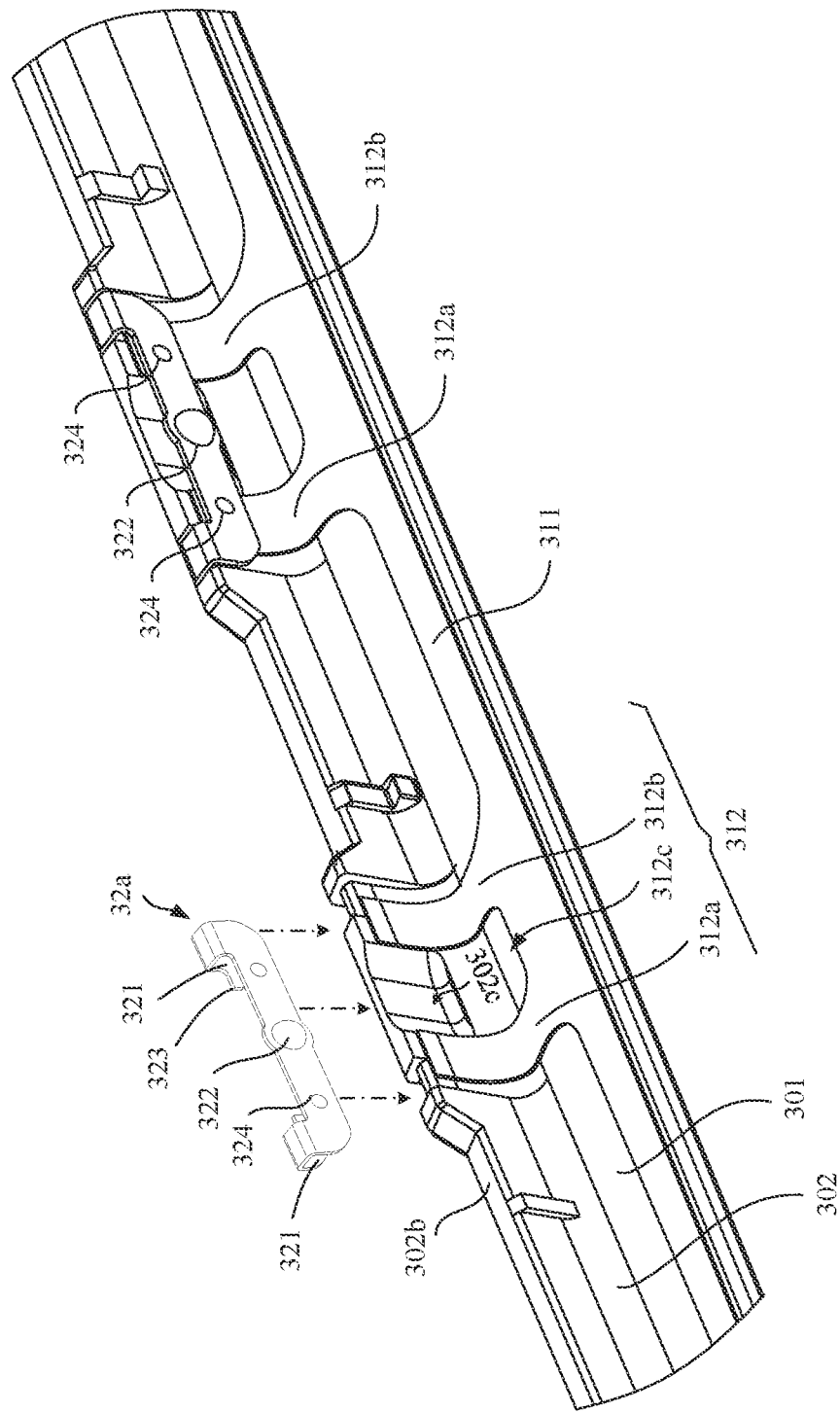
FIG. 22 is a schematic diagram of a structure of assembly between a conductive spring, an electrostatic protection structure, and an insulation top cover in another direction according to an embodiment of this application.

In this embodiment of this application, when the conductive spring 32a is assembled with the insulation top cover 30, as shown in FIG. 22, the electrostatic protection structure 31 is first disposed on the inner surface of the insulation top cover 30. The sub-pin 312a and the sub-pin 312b of the electrostatic protection structure 31 extend to the assembly end 302b of the connecting part 302 of the insulation top cover 30, and an avoidance groove 302c is provided on an inner wall that is of the assembly end 302b and that is opposite the spacing 312c between the sub-pin 312a the sub-pin 312b.

Figure 23:
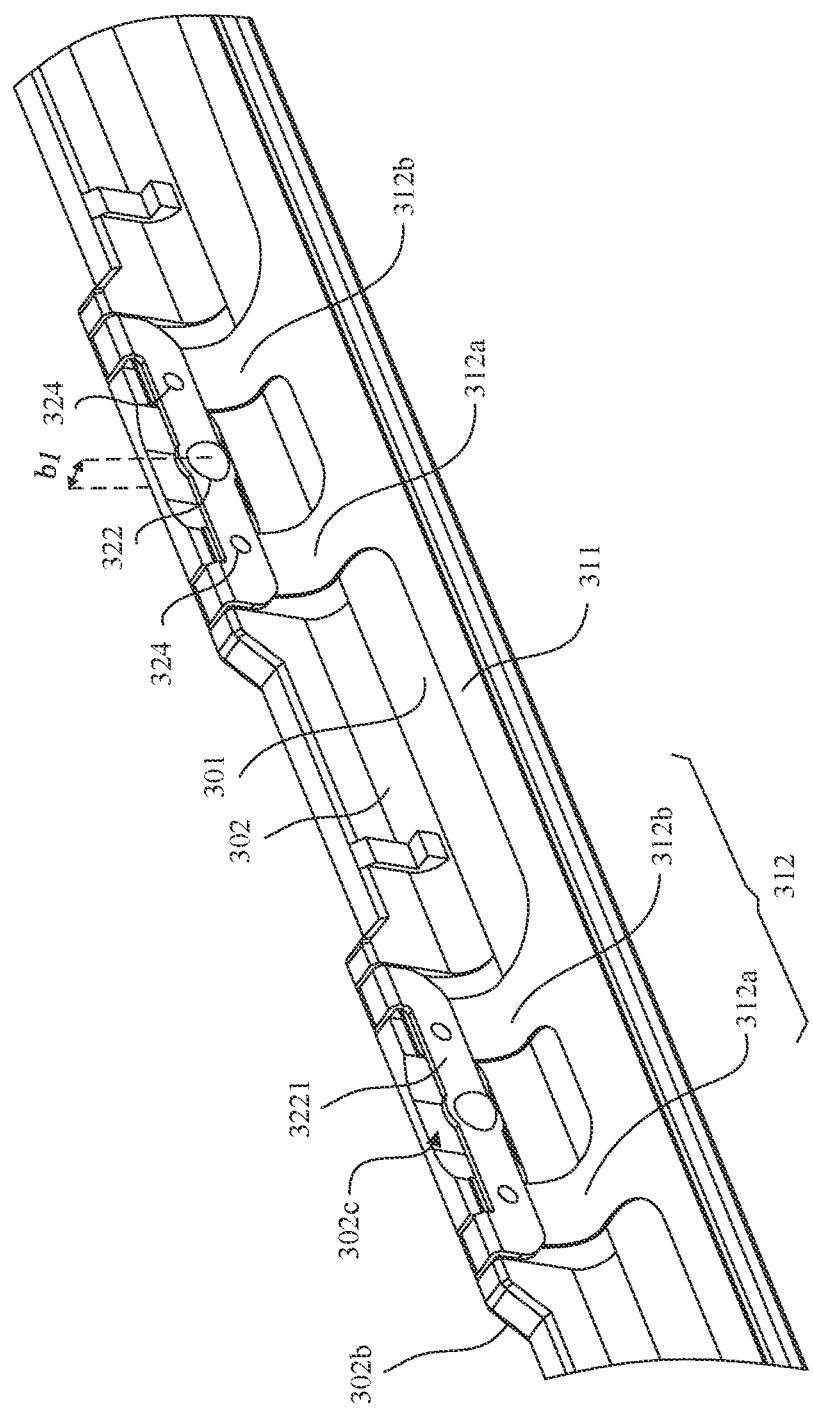
FIG. 23 is a schematic diagram of a partial structure obtained by combining a conductive spring, an electrostatic protection structure, and an insulation top cover according to an embodiment of this application.

In this way, when the conductive spring 32a is assembled at the assembly end 302b, as shown in FIG. 23, avoidance space is formed between a side wall 3221 of the first abutting part 322 disposed on the conductive spring 32a and the avoidance groove 302c. When the conductive spring 32a fits with the assembly groove 401 of the middle frame 40 along with the insulation top cover 30, to implement close contact between the first abutting part 322 of the conductive spring 32a and the inner wall of the assembly groove 401, the width b2 (as shown in FIG. 16) of the assembly groove 401 of the middle frame 40 is usually less than a width b1 (as shown in FIG. 23) of the conductive spring 32a. Therefore, during assembly, the first abutting part 322 is usually subject to an external force applied by the inner wall of the assembly groove 401 of the middle frame 40. In this case, the conductive spring 32a may be deformed at the avoidance groove 302c under an action of the external force, so that the conductive spring 32a installed on the insulation top cover 30 may be clamped in the assembly groove 401 of the middle frame 40.

After the assembly is completed, as shown in FIG. 16, it is ensured that the first abutting part 322 closely abuts against the inner wall of the assembly groove 401 of the middle frame 40 under the action of the elastic force of the conductive spring 32a. In addition, the reaction force of the inner wall of the assembly groove 401 of the middle frame 40 on the first abutting part 322 enables the second abutting part 324 of the conductive spring 32a to be in close electrical contact with the ground pin 312.

Therefore, in this embodiment of this application, the spacing 312c is disposed between the sub-pin 312a and the sub-pin 312b, so that a side that is of the avoidance groove 302c and that faces the conductive spring 32a is open. The spacing 312c can avoid elastic deformation of the side wall 3221 of the first abutting part 322 disposed on the conductive spring 32a, to ensure that the conductive spring 32a is assembled in the assembly groove 401 of the middle frame 40.

It should be noted that, when the entire phone is assembled, the conductive spring 32a may be first installed on the insulation top cover 30. Because the conductive silver paste on the electrostatic protection structure 31 is prone to powder shedding when scratched, conductivity is reduced.

As a result, there is no reliable electrical contact between the electrostatic protection structure 31 and the conductive spring 32a. Therefore, the conductive spring 32a may be first installed on the insulation top cover 30, and then the insulation top cover 30 is installed on other components. During the installation process, scratches occur on the conductive spring 32a and the middle frame 40. However, the conductive spring 32a and the electrostatic protection structure 31 are relatively static, and no scratch occurs, to ensure effective electrical contact between the conductive spring 32a and the electrostatic protection structure 31.

Figure 24:
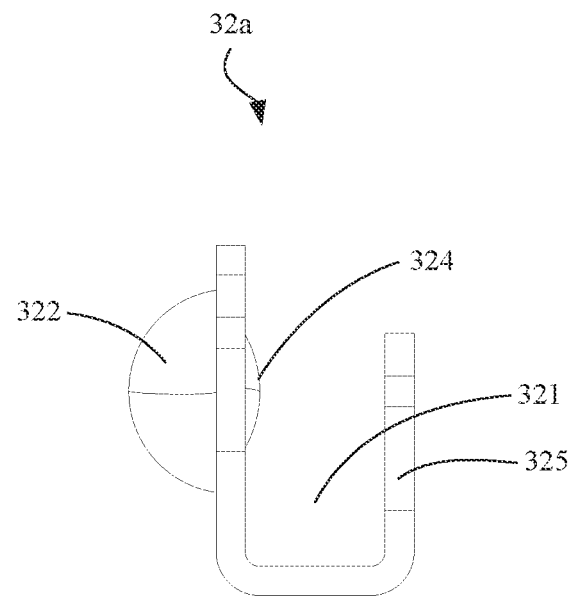
FIG. 24 is a side view of a conductive spring according to an embodiment of this application.
Figure 25:
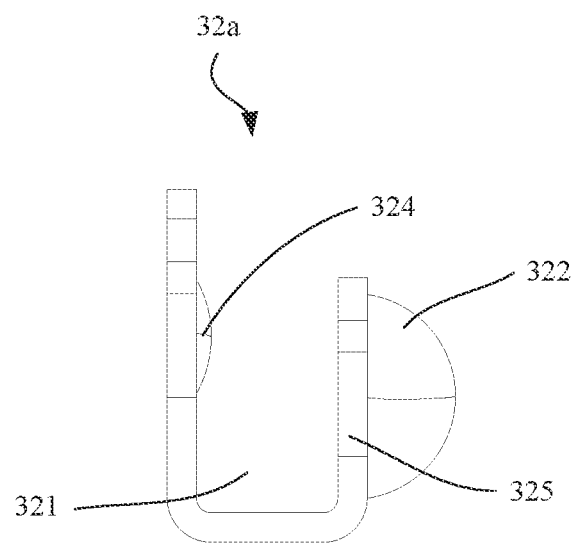
FIG. 25 is a side view of a conductive spring according to an embodiment of this application.

In this embodiment of this application, as shown in FIG. 16 and FIG. 24, the first abutting part 322 and the second abutting part 324 are disposed on a same side wall (as shown in FIG. 24) of the conductive spring 32a. In some other examples, the first abutting part 322 and the second abutting part 324 are not limited to being disposed on the same side wall of the conductive spring 32a. For example, as shown in FIG. 25, the first abutting part 322 and the second abutting part 324 may alternatively be disposed on two opposite side walls of the conductive spring 32a respectively. Alternatively, as shown in FIG. 26, the first abutting part 322 may be disposed on two opposite side walls of the conductive spring 32a. In this embodiment of this application, it can be ensured that the first abutting part 322 protrudes toward a direction of the middle frame 40 and is electrically connected to the middle frame 40, and that the second abutting part 324 protrudes toward a side of the ground pin 312 of the electrostatic protection structure 31 and is electrically connected to the ground pin 312 of the electrostatic protection structure 31.

Figure 27:
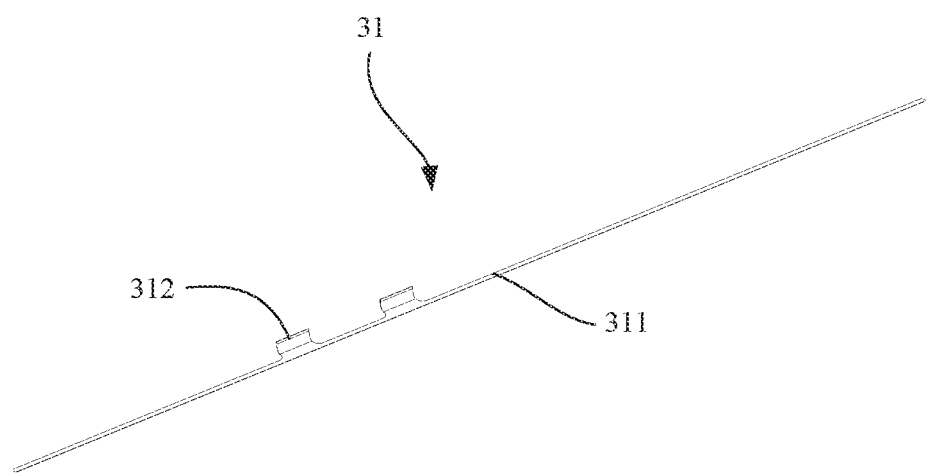
FIG. 27 is a schematic diagram of a structure of an electrostatic protection structure according to an embodiment of this application.
Figure 28:
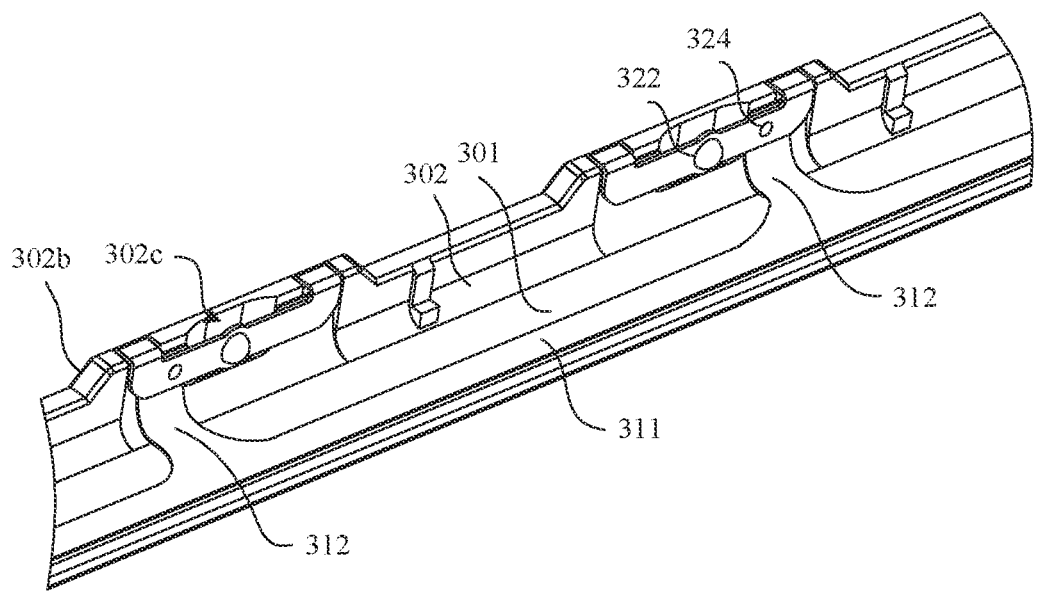
FIG. 28 is a schematic diagram of a partial structure obtained by combining a conductive spring, an electrostatic protection structure in FIG. 27, and an insulation top cover.

In this embodiment of this application, as shown in FIG. 27, the ground pin 312 of the electrostatic protection structure 31 may alternatively be an entire sheet-like structure. For example, the ground pin 312 may include one sub-pin 312a (as shown in FIG. 20). In this way, during assembly, as shown in FIG. 28, one second abutting part 324 may be disposed on each conductive spring 32a to be in electrical contact with the ground pin 312.

Figure 29:
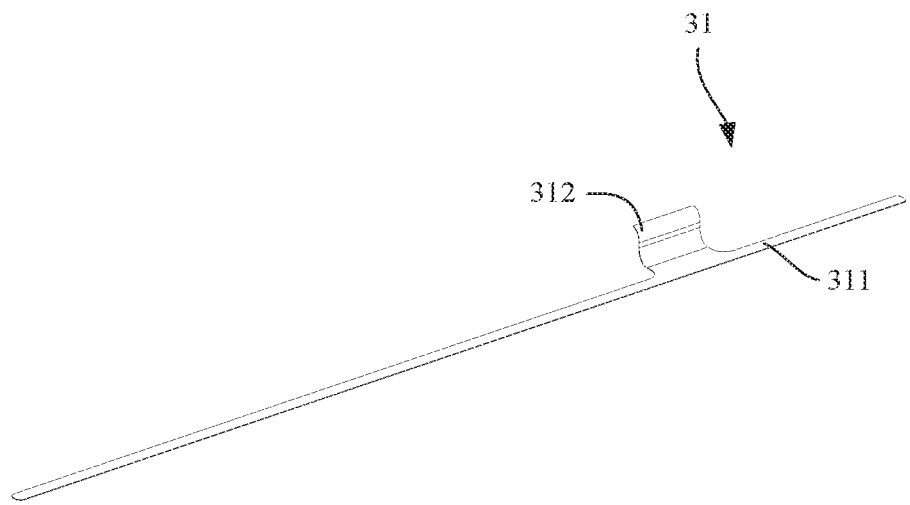
FIG. 29 is a schematic diagram of a structure of an electrostatic protection structure according to an embodiment of this application.
Figure 30:
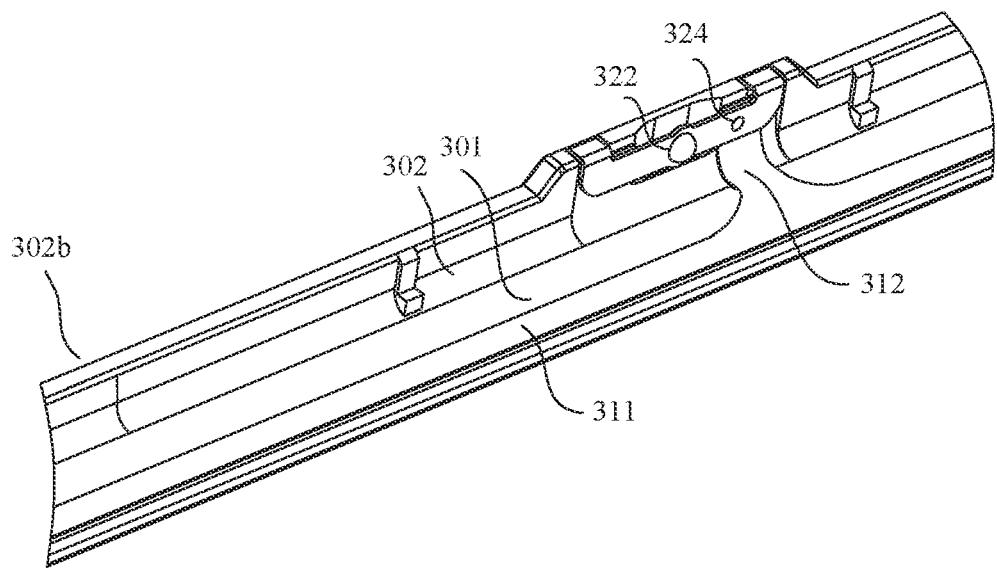
FIG. 30 is a schematic diagram of a partial structure obtained by combining a conductive spring, an electrostatic protection structure in FIG. 29, and an insulation top cover.

As shown in FIG. 29, there may be one ground pin 312 of the electrostatic protection structure 31. In this way, during assembly, as shown in FIG. 30, one conductive spring 32a may be disposed, and one second abutting part 324 is disposed on the conductive spring 32a to be in electrical contact with the ground pin 312.

One ground pin 312 is disposed to implement the electrical connection between the electrostatic protection structure 31 and the middle frame 40, and a size of the ground pin 312 is small, so that materials can be reduced. In addition, a position of the ground pin 312 may be flexibly set based on a position of the middle frame 40, to facilitate a connection between the ground pin 312 and the middle frame 40, and avoid impact of the electrostatic protection structure 31 on the antenna radiator.

Figure 31:
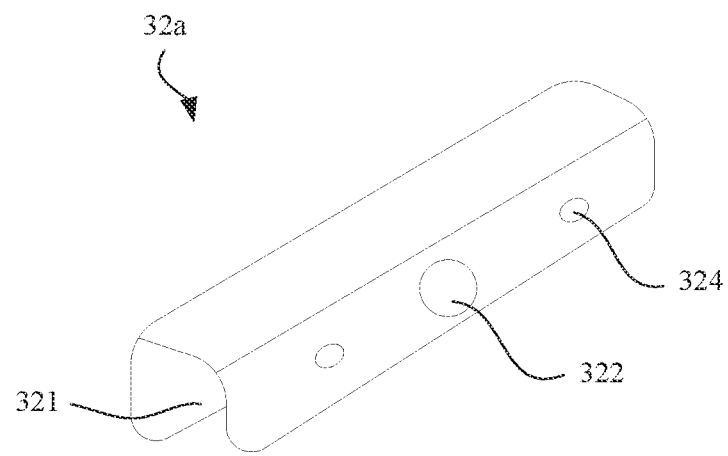
FIG. 31 is a schematic diagram of another structure of a conductive spring according to an embodiment of this application.

In a possible implementation, a structure of the conductive spring 32a includes, but is not limited to, the structure shown in FIG. 17. For example, in this embodiment of this application, the structure of the conductive spring 32a may alternatively be shown in FIG. 31. The conductive spring 32a has one clamping part 321. The clamping part 321 is a through slot, the first abutting part 322 is provided on an outer side wall of the clamping part 321, and the second abutting part 324 is provided on an inner side wall of the clamping part 321. The second abutting part 324 may be a structure in which the outer side wall of the clamping part 321 protrudes toward the inner side wall of the clamping part 321. A position-limiting structure may also be provided on the conductive spring 32a shown in FIG. 31, so that the conductive spring 32a is not easily disconnected after being installed on the insulation top cover 30 by using the position-limiting structure.

Figure 32:
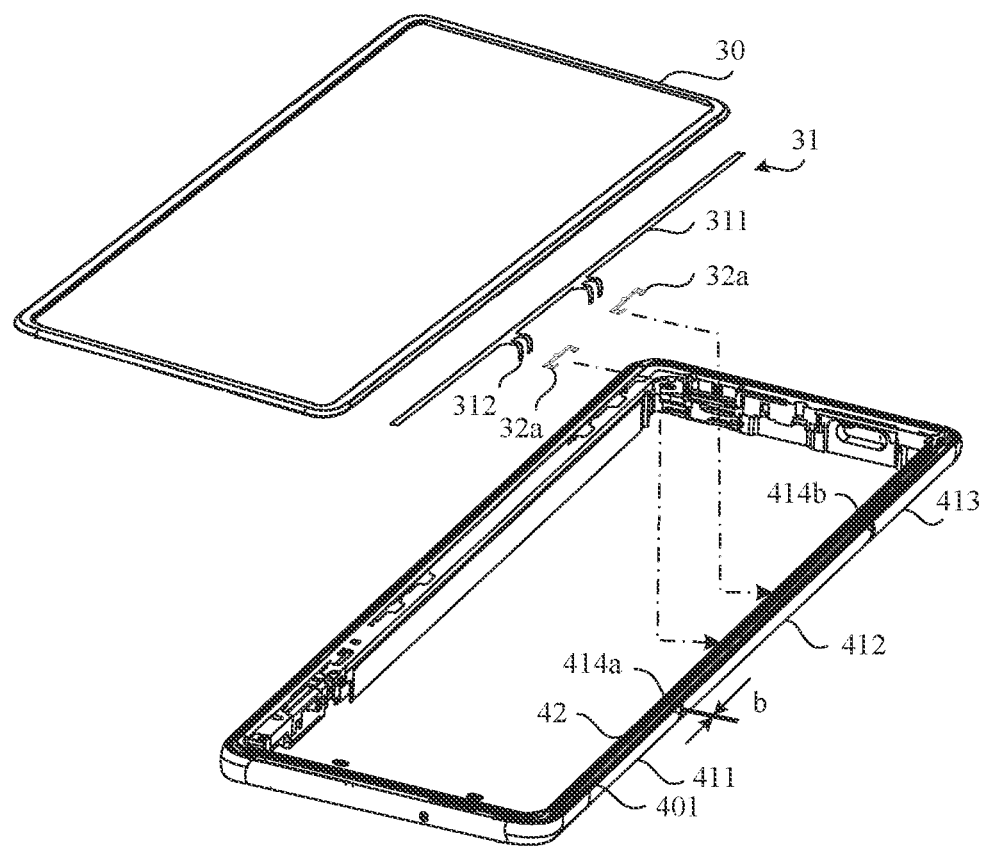
FIG. 32 is a schematic diagram of assembly between an electrostatic protection structure, an insulation top cover, a conductive spring, and a middle frame according to an embodiment of this application.

In this embodiment of this application, as shown in FIG. 32, the first metal frame 411 and the third metal frame 413 may be antenna radiators, and therefore the ground pin 312 of the electrostatic protection structure 31 is electrically connected to the second metal frame 412 through the conductive spring 32a.

Figure 33:
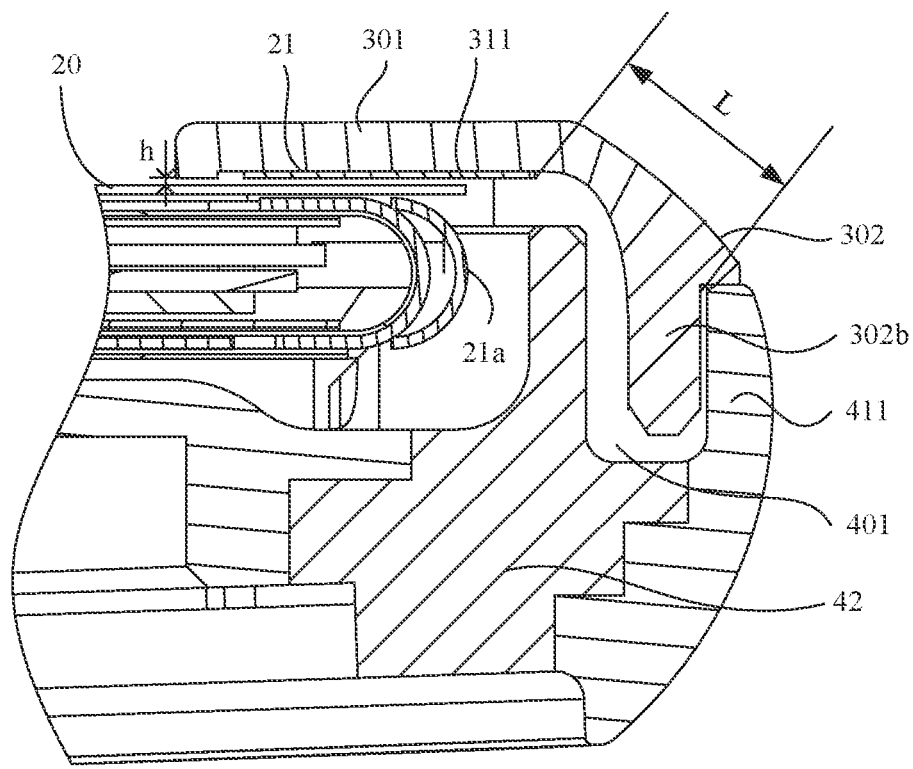
FIG. 33 is a partial sectional view of a side of an electronic device in which an electrostatic protection structure is disposed when the electronic device provided in FIG. 14 is cut along a B-B direction in FIG. 1.

To reduce or avoid impact of the guide part 311 of the electrostatic protection structure 31 on radiation of the first metal frame 411 and the third metal frame 413, a distance between the guide part 311 of the electrostatic protection structure 31 and each of the first metal frame 411 and the third metal frame 413 is greater than 0.8 mm. For example, as shown in FIG. 33, a shortest distance L between the guide part 311 of the electrostatic protection structure 31 and the first metal frame 411 is greater than 0.8 mm. Correspondingly, a shortest distance between the guide part 311 of the electrostatic protection structure 31 and the third metal frame 413 is also greater than 0.8 mm. This ensures that the guide part 311 of the electrostatic protection structure 31 is located outside a clearance between the first metal frame 411 and the third metal frame 413, and therefore there is a specific clearance when the first metal frame 411 and the third metal frame 413 are used as antenna radiators.

It should be noted that the distance between the guide part 311 of the electrostatic protection structure 31 and each of the first metal frame 411 and the third metal frame 413 does not constitute a limitation on the protection scope of the technical solutions in this application. For terminals of different models and different types, the distance is, but is not limited to be, greater than 0.8 mm, and may alternatively be greater than 1 mm, 2 mm, or the like, provided that the guide part 311 of the electrostatic protection structure 31 does not affect the radiation of the first metal frame 411 and the third metal frame 413. The distance may be set based on a specific case.

Figure 34:
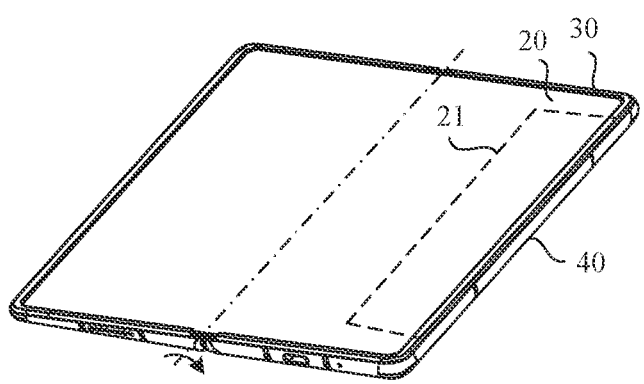
FIG. 34 is a schematic diagram of a three-dimensional structure of a foldable electronic device according to an embodiment of this application.
Figure 35:
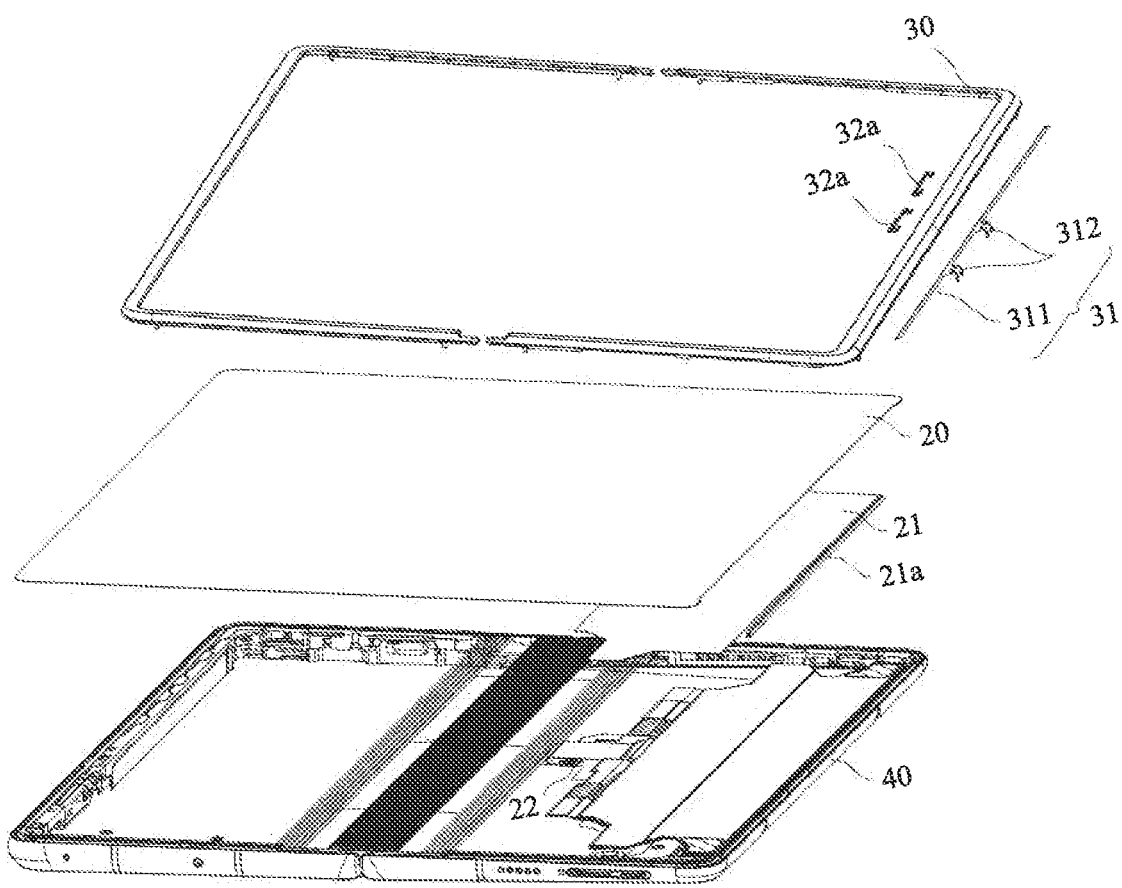
FIG. 35 is a schematic diagram of an exploded structure of the electronic device in FIG. 34.

FIG. 34 and FIG. 35 are schematic diagrams in which a foldable phone may also be applied in this scenario. Bending is required for the foldable phone, and therefore there is usually the gap (as shown in FIG. 33) between the display 20 and the insulation top cover 30. However, in this embodiment of this application, the electrostatic protection structure 31 is provided, and the ground pin 312 of the electrostatic protection structure 31 is electrically connected to the middle frame 40 of the foldable phone through the conductive spring 32a. In this way, after entering from the gap, static electricity is transferred to the middle frame through the electrostatic protection structure 31 to implement grounding, to avoid damage to the bending region 21a of the flexible printed circuit 21 caused by the static electricity entering from the gap.

In the foldable phone, the bending region 21a of the flexible printed circuit 21 may be disposed close to any frame in the middle frame 40 of the foldable phone, and the electrostatic protection structure 31 is disposed on an inner surface that is of the insulation top cover 30 and that corresponds to the flexible printed circuit 21.

The electrostatic protection structure 31 is disposed to implement an antistatic function of the foldable phone and ensure normal use of the foldable phone. In addition, the electrostatic protection structure 31 is disposed to avoid interference to radiation of a frame antenna in the foldable phone.

In the descriptions in this application, it should be noted that, unless otherwise specified or limited, terms such as "installation", "connected", and "connection" should be construed in a broad sense, for example, may be a fixed connection, may be an indirect connection through an intermediate medium, or may be an internal connection between two elements or an interaction relationship between two elements. For a person of ordinary skill in the art, specific meanings of the foregoing terms in this application may be understood based on a specific case.

An apparatus or element in this application or an implied apparatus or element needs to have a specific direction and be constructed and operated in a specific direction, and therefore cannot be construed as a limitation to this application. In the descriptions of this application, "a plurality of" means two or more, unless otherwise precisely and specifically specified.

In the specification, claims, and accompanying drawings of this application, the terms "first". "second", "third", "fourth", and the like (if existent) are intended to distinguish between similar objects, but do not necessarily indicate a specific order or sequence. It should be understood that the data termed in such a way are interchangeable in proper circumstances so that embodiments of this application described herein can be implemented in an order other than the orders illustrated or described herein. In addition, the terms "include" and "contain" and any other variants thereof are intended to cover the non-exclusive inclusion. For example, a process, method, system, product, or device that includes a list of steps or units is not necessarily limited to those expressly listed steps or units, but may include other steps or units not expressly listed or inherent to such a process, method, product, or device.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions in embodiments of this application.

What is claimed is:

1. An electronic device, comprising:
   a flexible printed circuit;
   a display having an outer edge and an end connected to the flexible printed circuit;
   a ground;
   a middle frame comprising:
     a metal part electrically connected to the ground; and
     an assembly groove at a first end of the middle frame;
   an insulation top cover comprising:
     an inner surface proximate to the flexible printed circuit;
     a first part located above the outer edge of the display; and
     a second part connected to the middle frame and located in the assembly groove, wherein the first end is located close to the insulation top cover; and
   an electrostatic protection structure disposed on the inner surface of the insulation top cover, wherein the electrostatic protection structure comprises:
     a guide part; and
     ground pins electrically connected to the guide part and the metal part of the middle frame and comprising a first ground pin and a second ground pin disposed at intervals.

2. The electronic device of claim 1, wherein the flexible printed circuit comprises a bending region proximate to the middle frame, and wherein the electrostatic protection structure is disposed proximate to the bending region.

3. The electronic device of claim 2, wherein the middle frame comprises an outer metal frame and an inner insulation frame, wherein at least a part of the outer metal frame is located on an outer side of the inner insulation frame, and wherein the electrostatic protection structure is electrically connected to the outer metal frame.

4. The electronic device of claim 3, wherein the inner insulation frame comprises an inner wall, wherein the electrostatic protection structure is disposed on the inner wall and is proximate to the bending region, wherein the guide part extends along a width direction of the flexible printed circuit, and wherein the ground pins are electrically connected to the outer metal frame.

5. The electronic device of claim 3, wherein a distance between the guide part and the outer edge of the display is less than a distance between the bending region and the outer edge of the display.

6. The electronic device of claim 3, wherein the electrostatic protection structure is disposed on the inner surface of the insulation top cover, and wherein the electrostatic protection structure comprises:
   a first electrostatic protection structure end that is proximate to the first part that is away from the middle frame; and
   a second electrostatic protection structure end electrically connected to the outer metal frame.

7. The electronic device of claim 3, further comprising at least one conductive spring coupled to the second part, wherein the conductive spring is in electrical contact with the electrostatic protection structure, and wherein the conductive spring electrically connects the electrostatic protection structure to the outer metal frame.

8. The electronic device of claim 7, wherein the conductive spring has at least one first abutting part configured to be electrically connected with the middle frame such that the conductive spring is electrically connected to the middle frame.

9. The electronic device of claim 8, wherein the second part further comprises a first side wall having an avoidance groove, wherein the conductive spring further comprises a second side wall on which the first abutting part is disposed, and wherein the avoidance groove is opposite the second side wall.

10. The electronic device of claim 7, wherein the conductive spring further comprises at least one second abutting part configured to be electrically connected with the electrostatic protection structure.

11. The electronic device of claim 7, wherein the conductive spring further comprises at least one clamping part configured to clamp the second part such that the conductive spring is coupled to the insulation top cover.

12. The electronic device of claim 11, wherein the at least one clamping part is a clamping groove, and wherein a width of the clamping groove is less than a wall thickness at the second part.

13. The electronic device of claim 11, wherein the conductive spring further has a position-limiting part, and wherein the second part comprises a position-limiting slot fitting with the position-limiting part at the second part.

14. The electronic device of claim 13, wherein the position-limiting part is a hook-shaped structure formed by extending a clamping side wall of the at least one clamping part.

15. The electronic device of claim 1, wherein the electrostatic protection structure comprises a conductive layer made of a silver material.

16. The electronic device of claim 1, wherein the middle frame comprises:
  a first metal frame configured as a first antenna radiator;
  a third metal frame configured as a second antenna radiator; and
  a second metal frame separated from the first metal frame and the third metal frame and disposed between the first metal frame and the third metal frame, wherein the second metal frame is electrically connected to the ground pins, and
  wherein the ground pins are disposed away from the first metal frame and the third metal frame.

17. The electronic device of claim 16, wherein the second metal frame comprises two ends, and wherein a spacing width between each of the two ends and each of the first metal frame and the third metal frame is greater than 0.8 millimeters (mm).

18. The electronic device of claim 1, wherein the first part and the outer edge of the display at least partially overlap in a thickness direction of the electronic device, and wherein there is a gap between the first part and the display.

19. The electronic device of claim 18, wherein the first part comprises a flat outer surface, and wherein the second part comprises an outer surface that is slanted or arced.

\* \* \* \* \*